US012147009B2

(12) United States Patent
Hart et al.

(10) Patent No.: US 12,147,009 B2
(45) Date of Patent: Nov. 19, 2024

(54) TEXTURED REGION TO REDUCE SPECULAR REFLECTANCE INCLUDING A LOW REFRACTIVE INDEX SUBSTRATE WITH HIGHER ELEVATED SURFACES AND LOWER ELEVATED SURFACES AND A HIGH REFRACTIVE INDEX MATERIAL DISPOSED ON THE LOWER ELEVATED SURFACES

(71) Applicant: Corning Incorporated, Corning, NY (US)

(72) Inventors: Shandon Dee Hart, Elmira, NY (US); Karl William Koch, III, Elmira, NY (US); Wageesha Senaratne, Horseheads, NY (US); William Allen Wood, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 697 days.

(21) Appl. No.: 17/369,279

(22) Filed: Jul. 7, 2021

(65) Prior Publication Data

US 2022/0011477 A1    Jan. 13, 2022

Related U.S. Application Data

(60) Provisional application No. 63/049,843, filed on Jul. 9, 2020.

(51) Int. Cl.
*G02B 1/11* (2015.01)
*C03C 15/00* (2006.01)
(Continued)

(52) U.S. Cl.
CPC ............... *G02B 1/11* (2013.01); *C03C 15/00* (2013.01); *C23C 14/021* (2013.01);
(Continued)

(58) Field of Classification Search
CPC ........... G02B 1/11; G02B 1/14; C23C 14/042; C23C 14/021
(Continued)

(56) References Cited

U.S. PATENT DOCUMENTS 3,067,021 A    12/1962   Pelley et al.
3,150,032 A     9/1964   Rubenstein
(Continued)

FOREIGN PATENT DOCUMENTS

AU         199540318        8/1996
AU      2015252116 A1      11/2015
(Continued)

OTHER PUBLICATIONS

Translationof2015108266 (Year: 2024).*
(Continued)

*Primary Examiner* — Jerry L Brooks
(74) *Attorney, Agent, or Firm* — William J. Tucker

(57) ABSTRACT

A substrate for a display article includes (a) a primary surface; and (b) a textured region on at least a portion of the primary surface, the textured region comprising: (i) one or more higher surfaces residing at a higher mean elevation parallel to a base-plane disposed below the textured region and extending through the substrate; (ii) one or more lower surfaces residing at a lower mean elevation parallel to the base-plane that is less than the higher mean elevation; and (iii) a high-index material disposed on each of the one or more lower surfaces residing at the lower mean elevation, the high-index material forming one or more intermediate surfaces residing at an intermediate mean elevation parallel to the base-plane that is greater than the lower mean elevation but less than the higher mean elevation, the high-index material comprising an index of refraction that is greater than the index of refraction of the substrate.

23 Claims, 15 Drawing Sheets

(51) Int. Cl.
  *C23C 14/02* (2006.01)
  *C23C 14/04* (2006.01)
  *C23C 16/02* (2006.01)
  *C23C 16/04* (2006.01)
  *G02B 1/118* (2015.01)
  *G02B 1/14* (2015.01)
  *G02B 5/02* (2006.01)
  *G02B 27/42* (2006.01)

(52) U.S. Cl.
  CPC ........ *C23C 14/042* (2013.01); *C23C 16/0227* (2013.01); *C23C 16/042* (2013.01); *G02B 1/118* (2013.01); *G02B 1/14* (2015.01); *G02B 5/0221* (2013.01); *G02B 5/0268* (2013.01); *G02B 27/4205* (2013.01); *G02B 27/4272* (2013.01); *G02B 2207/101* (2013.01)

(58) Field of Classification Search
  USPC ........................................................ 359/601
  See application file for complete search history.

(56) References Cited

U.S. PATENT DOCUMENTS

| | | |
|---|---|---|
| 3,413,058 A | 11/1968 | Fang et al. |
| 4,687,707 A | 8/1987 | Matsuo et al. |
| 4,797,316 A | 1/1989 | Hecq et al. |
| 4,946,923 A | 8/1990 | Nagata et al. |
| 5,470,606 A | 11/1995 | De Boer |
| 5,618,619 A | 4/1997 | Petrmichl et al. |
| 5,737,472 A | 4/1998 | Bernasson et al. |
| 5,891,556 A * | 4/1999 | Anderson ......... B32B 17/10174 359/359 |
| 6,046,855 A | 4/2000 | Goto |
| 6,208,389 B1 | 3/2001 | Aben et al. |
| 6,219,121 B1 | 4/2001 | Sahouani et al. |
| RE37,183 E | 5/2001 | Kawamura et al. |
| 6,254,913 B1 | 7/2001 | Wadsworth et al. |
| 6,286,965 B1 | 9/2001 | Caskey et al. |
| 6,340,404 B1 | 1/2002 | Oka et al. |
| 6,521,677 B2 | 2/2003 | Yashiro et al. |
| 6,723,423 B1 | 4/2004 | Kaneko et al. |
| 6,824,709 B2 | 11/2004 | Shundo |
| 6,846,599 B2 | 1/2005 | Ide |
| 6,862,139 B2 | 2/2005 | Chang et al. |
| 7,037,573 B2 | 5/2006 | Miyatake et al. |
| 7,122,253 B2 | 10/2006 | Yamaguchi et al. |
| 7,128,428 B2 | 10/2006 | Takahashi et al. |
| 7,149,032 B2 | 12/2006 | Ohishi et al. |
| 7,171,676 B2 | 1/2007 | Takeda et al. |
| 7,253,861 B2 | 8/2007 | Niiyama et al. |
| 7,264,866 B2 | 9/2007 | Hashimoto et al. |
| 7,332,213 B2 | 2/2008 | Mimura et al. |
| 7,371,439 B2 | 5/2008 | Matsunaga et al. |
| 7,371,786 B2 | 5/2008 | Yoshihara et al. |
| 7,390,099 B2 | 6/2008 | Takao et al. |
| 7,410,686 B2 | 8/2008 | Osada et al. |
| 7,542,207 B2 | 6/2009 | Matsunaga |
| 7,604,358 B2 | 10/2009 | Ninomiya et al. |
| 7,629,400 B2 | 12/2009 | Hyman |
| 7,645,502 B2 | 1/2010 | Mikami et al. |
| 7,737,633 B2 | 6/2010 | Zheng |
| 7,796,123 B1 | 9/2010 | Irvin et al. |
| 7,799,732 B2 | 9/2010 | Tanaka et al. |
| 7,903,340 B2 | 3/2011 | Nagahama et al. |
| 7,973,892 B2 | 7/2011 | Lim |
| 8,026,021 B2 | 9/2011 | Stumpe et al. |
| 8,062,731 B2 | 11/2011 | Takada et al. |
| 8,110,278 B2 | 2/2012 | Hsu et al. |
| 8,124,215 B2 | 2/2012 | Takao et al. |
| 8,304,055 B2 | 11/2012 | Haga et al. |
| 8,312,739 B2 | 11/2012 | Lee et al. |
| 8,325,418 B2 | 12/2012 | Nagahama et al. |
| 8,514,351 B2 | 8/2013 | Sasaki et al. |
| 8,561,429 B2 | 10/2013 | Allan et al. |
| 8,628,896 B2 | 1/2014 | Ikeda et al. |
| 8,845,172 B2 | 9/2014 | Jang et al. |
| 8,854,623 B2 | 10/2014 | Fontaine et al. |
| 8,888,965 B2 | 11/2014 | Kuppuswamy et al. |
| 9,023,457 B2 | 5/2015 | Carrilero et al. |
| 9,051,404 B2 | 6/2015 | Jiang et al. |
| 9,051,423 B2 | 6/2015 | Qiu |
| 9,079,802 B2 | 7/2015 | Bellman et al. |
| 9,102,131 B2 | 8/2015 | Derks et al. |
| 9,158,044 B2 | 10/2015 | Akiyama et al. |
| 9,263,202 B2 | 2/2016 | Lee et al. |
| 9,316,885 B2 | 4/2016 | Lo et al. |
| 9,335,444 B2 | 5/2016 | Hart et al. |
| 9,359,261 B2 | 6/2016 | Bellman et al. |
| 9,366,784 B2 | 6/2016 | Bellman et al. |
| 9,400,420 B2 | 7/2016 | Pudleiner et al. |
| 9,411,180 B2 | 8/2016 | Gollier et al. |
| 9,418,193 B2 | 8/2016 | Dowski et al. |
| 9,535,280 B2 | 1/2017 | Borrelli et al. |
| 9,550,161 B2 | 1/2017 | Arfsten et al. |
| 9,573,842 B2 | 2/2017 | Gollier et al. |
| 9,581,731 B2 | 2/2017 | Bookbinder et al. |
| 9,588,263 B2 | 3/2017 | Gollier et al. |
| 9,651,720 B2 | 5/2017 | Lander et al. |
| 9,701,248 B2 | 7/2017 | Neuman et al. |
| 9,701,579 B2 | 7/2017 | Gollier et al. |
| 9,703,011 B2 | 7/2017 | Adib et al. |
| 9,718,249 B2 | 8/2017 | Kwong |
| 9,726,786 B2 | 8/2017 | Hart et al. |
| 9,766,376 B2 | 9/2017 | Ho et al. |
| 9,786,194 B2 | 10/2017 | Hyman |
| 9,823,209 B2 | 11/2017 | Yu et al. |
| 9,880,328 B2 | 1/2018 | Gollier et al. |
| 9,896,596 B2 | 2/2018 | Jung et al. |
| 9,939,557 B2 | 4/2018 | David et al. |
| 9,964,773 B2 | 5/2018 | Wang |
| 9,987,820 B2 | 6/2018 | Mehlmann et al. |
| 10,183,889 B2 | 1/2019 | Gollier et al. |
| 10,613,340 B2 | 4/2020 | Borrelli et al. |
| 10,698,151 B2 | 6/2020 | Hamilton et al. |
| 10,899,661 B2 | 1/2021 | Gollier et al. |
| 10,921,492 B2 | 2/2021 | Gregorski et al. |
| 10,948,629 B2 | 3/2021 | Hart et al. |
| 2002/0085284 A1 | 7/2002 | Nakamura et al. |
| 2002/0090507 A1 | 7/2002 | Barth et al. |
| 2002/0167629 A1 | 11/2002 | Blanchard |
| 2003/0234460 A1 | 12/2003 | Hayashi et al. |
| 2004/0005482 A1 | 1/2004 | Kobayashi et al. |
| 2004/0184765 A1 | 9/2004 | DiFrancesco et al. |
| 2004/0188874 A1 | 9/2004 | Hikita et al. |
| 2004/0195960 A1 | 10/2004 | Czeremuszkin et al. |
| 2004/0233174 A1 | 11/2004 | Robrecht et al. |
| 2005/0007019 A1 | 1/2005 | Kim et al. |
| 2005/0074591 A1 | 4/2005 | Zagdoun |
| 2005/0287309 A1 | 12/2005 | Veerasamy |
| 2006/0152801 A1 | 7/2006 | Matsunaga |
| 2006/0153979 A1 | 7/2006 | Asakura et al. |
| 2006/0240266 A1 | 10/2006 | Schicht et al. |
| 2006/0274047 A1 | 12/2006 | Spath et al. |
| 2006/0274048 A1 | 12/2006 | Spath et al. |
| 2006/0286465 A1 | 12/2006 | Kim |
| 2007/0014981 A1 | 1/2007 | Chiang et al. |
| 2007/0141357 A1 | 6/2007 | Bekiarian et al. |
| 2007/0152985 A1 | 7/2007 | Ostergaard et al. |
| 2007/0166536 A1 | 7/2007 | Dollase et al. |
| 2007/0240804 A1 | 10/2007 | Arai et al. |
| 2007/0249789 A1 | 10/2007 | Buehler et al. |
| 2007/0266896 A1 | 11/2007 | Suwa et al. |
| 2008/0138606 A1 | 6/2008 | Yoshihara et al. |
| 2008/0191463 A1 | 8/2008 | Vermeulen et al. |
| 2009/0004462 A1 | 1/2009 | Zhang et al. |
| 2009/0017314 A1 | 1/2009 | Nadaud et al. |
| 2009/0051668 A1 | 2/2009 | Cheng |
| 2009/0104385 A1 | 4/2009 | Reymond et al. |
| 2009/0135492 A1 | 5/2009 | Kusuda et al. |
| 2009/0178704 A1 | 7/2009 | Kalejs et al. |
| 2009/0268299 A1 | 10/2009 | Furui et al. |
| 2010/0009154 A1 | 1/2010 | Allan et al. |

(56) References Cited

U.S. PATENT DOCUMENTS

| | | |
|---|---|---|
| 2010/0027383 A1 | 2/2010 | Suzuki et al. |
| 2010/0062217 A1 | 3/2010 | Kurematsu |
| 2010/0130348 A1 | 5/2010 | Kang et al. |
| 2010/0149483 A1 | 6/2010 | Chiavetta, III |
| 2010/0167019 A1 | 6/2010 | Ohyanagi et al. |
| 2010/0177398 A1 | 7/2010 | Watanabe et al. |
| 2010/0182551 A1 | 7/2010 | Tochigi et al. |
| 2010/0195311 A1 | 8/2010 | Furui et al. |
| 2010/0196650 A1 | 8/2010 | Okawa et al. |
| 2010/0196685 A1 | 8/2010 | Murata et al. |
| 2010/0238384 A1 | 9/2010 | Tochigi et al. |
| 2010/0258752 A1 | 10/2010 | Mochizuki et al. |
| 2010/0272990 A1 | 10/2010 | Bondesan et al. |
| 2010/0316861 A1 | 12/2010 | Kubler et al. |
| 2011/0064943 A1 | 3/2011 | Wang |
| 2011/0100424 A1 | 5/2011 | Roche et al. |
| 2011/0128664 A1 | 6/2011 | Coue et al. |
| 2012/0013983 A1 | 1/2012 | Chang et al. |
| 2012/0070603 A1 | 3/2012 | Hsu |
| 2012/0113043 A1 | 5/2012 | Liu et al. |
| 2012/0250135 A1 | 10/2012 | Yeh et al. |
| 2012/0270041 A1 | 10/2012 | Matsumoto et al. |
| 2013/0127202 A1 | 5/2013 | Hart |
| 2014/0090864 A1 | 4/2014 | Paulson |
| 2014/0093711 A1 | 4/2014 | Paulson |
| 2014/0106141 A1 | 4/2014 | Bellman et al. |
| 2014/0113083 A1 | 4/2014 | Lee et al. |
| 2014/0131091 A1 | 5/2014 | Smith |
| 2014/0154661 A1 | 6/2014 | Bookbinder et al. |
| 2014/0313441 A1 | 10/2014 | Lim |
| 2014/0320422 A1 | 10/2014 | Williams et al. |
| 2014/0376094 A1 | 12/2014 | Bellman et al. |
| 2015/0079368 A1 | 3/2015 | Koike et al. |
| 2015/0111725 A1 | 4/2015 | Van et al. |
| 2015/0160376 A1 | 6/2015 | Kohli et al. |
| 2015/0174625 A1 | 6/2015 | Hart et al. |
| 2015/0177778 A1 | 6/2015 | Chen et al. |
| 2015/0185554 A1 | 7/2015 | Zhao et al. |
| 2015/0250237 A1 | 9/2015 | Shoham et al. |
| 2015/0253467 A1 | 9/2015 | Sano |
| 2015/0309628 A1 | 10/2015 | Chen et al. |
| 2015/0316442 A1 | 11/2015 | Tamada et al. |
| 2015/0322270 A1 | 11/2015 | Amin et al. |
| 2015/0323705 A1 | 11/2015 | Hart et al. |
| 2015/0323812 A1 | 11/2015 | Ishak et al. |
| 2015/0355382 A1 | 12/2015 | Henn et al. |
| 2016/0002498 A1 | 1/2016 | Maghsoodi et al. |
| 2016/0016845 A1 | 1/2016 | Cho et al. |
| 2016/0041308 A1 | 2/2016 | Kramer et al. |
| 2016/0083835 A1 | 3/2016 | Adib et al. |
| 2016/0137548 A1* | 5/2016 | Cabral, Jr. ............... C03C 17/06 65/36 |
| 2016/0137873 A1 | 5/2016 | Kostromine et al. |
| 2016/0146978 A1 | 5/2016 | Lee et al. |
| 2016/0236974 A1 | 8/2016 | Sinapi et al. |
| 2016/0246154 A1 | 8/2016 | O'Keeffe |
| 2016/0306046 A1 | 10/2016 | Axelsson et al. |
| 2016/0362583 A1 | 12/2016 | Naik et al. |
| 2016/0373627 A1* | 12/2016 | Rasmussen ............... G02B 3/00 |
| 2017/0003420 A1 | 1/2017 | Berit-Debat et al. |
| 2017/0015584 A1 | 1/2017 | Krzyzak et al. |
| 2017/0050349 A1 | 2/2017 | Hara et al. |
| 2017/0129806 A1 | 5/2017 | Fujii et al. |
| 2017/0183255 A1 | 6/2017 | Walther et al. |
| 2017/0199307 A1 | 7/2017 | Hart et al. |
| 2017/0210666 A1 | 7/2017 | Chang et al. |
| 2017/0235418 A1 | 8/2017 | Inamoto et al. |
| 2017/0260620 A1 | 9/2017 | Cheah et al. |
| 2017/0276838 A1 | 9/2017 | Oishi et al. |
| 2017/0285227 A1 | 10/2017 | Chen et al. |
| 2017/0307790 A1 | 10/2017 | Bellman et al. |
| 2018/0095303 A1 | 4/2018 | Cho et al. |
| 2018/0128957 A1 | 5/2018 | Davis et al. |
| 2018/0162091 A1 | 6/2018 | Takeda et al. |
| 2018/0203163 A1 | 7/2018 | Thakkar et al. |
| 2018/0251398 A1 | 9/2018 | Ikegami et al. |
| 2018/0352668 A1 | 12/2018 | Amin et al. |
| 2018/0372919 A1 | 12/2018 | Suzuki et al. |
| 2019/0039935 A1 | 2/2019 | Couillard et al. |
| 2019/0039946 A1 | 2/2019 | Bayne et al. |
| 2019/0045038 A1 | 2/2019 | Zhou et al. |
| 2019/0062200 A1 | 2/2019 | He et al. |
| 2019/0219739 A1 | 7/2019 | Gregorski et al. |
| 2020/0057177 A1 | 2/2020 | Hart et al. |
| 2020/0158917 A1 | 5/2020 | Hart et al. |
| 2020/0158922 A1 | 5/2020 | Hayashi et al. |
| 2020/0377409 A1 | 12/2020 | Jin et al. |
| 2020/0379143 A1 | 12/2020 | Gu et al. |
| 2021/0017068 A1 | 1/2021 | Torfs et al. |
| 2021/0181382 A1 | 6/2021 | Gregorski et al. |
| 2022/0011467 A1 | 1/2022 | Feng et al. |

FOREIGN PATENT DOCUMENTS

| | | |
|---|---|---|
| CA | 2629555 A1 | 11/2009 |
| CN | 1312450 A | 9/2001 |
| CN | 1318722 A | 10/2001 |
| CN | 1653880 A | 8/2005 |
| CN | 1869736 A | 11/2006 |
| CN | 2859579 Y | 1/2007 |
| CN | 1936623 A | 3/2007 |
| CN | 1940601 A | 4/2007 |
| CN | 201165502 Y | 12/2008 |
| CN | 201483977 U | 5/2010 |
| CN | 201707457 U | 1/2011 |
| CN | 102109630 A | 6/2011 |
| CN | 201945707 U | 8/2011 |
| CN | 201984393 U | 9/2011 |
| CN | 202171708 U | 3/2012 |
| CN | 202177751 U | 3/2012 |
| CN | 202177765 U | 3/2012 |
| CN | 202182978 U | 4/2012 |
| CN | 102627407 A | 8/2012 |
| CN | 202615053 U | 12/2012 |
| CN | 102923969 A | 2/2013 |
| CN | 103013196 A | 4/2013 |
| CN | 103013219 A | 4/2013 |
| CN | 202904161 U | 4/2013 |
| CN | 103099529 A | 5/2013 |
| CN | 202924088 U | 5/2013 |
| CN | 202924096 U | 5/2013 |
| CN | 103171230 A | 6/2013 |
| CN | 203025361 U | 6/2013 |
| CN | 103254670 A | 8/2013 |
| CN | 103302934 A | 9/2013 |
| CN | 103305816 A | 9/2013 |
| CN | 203260587 U | 10/2013 |
| CN | 203535376 U | 4/2014 |
| CN | 203567294 U | 4/2014 |
| CN | 203620645 U | 6/2014 |
| CN | 103921487 A | 7/2014 |
| CN | 103934756 A | 7/2014 |
| CN | 203689480 U | 7/2014 |
| CN | 103964705 A | 8/2014 |
| CN | 104418511 A | 3/2015 |
| CN | 104559625 A | 4/2015 |
| CN | 104845544 A | 8/2015 |
| CN | 204727835 U | 10/2015 |
| CN | 204894681 U | 12/2015 |
| CN | 105446558 A | 3/2016 |
| CN | 105737103 A | 7/2016 |
| CN | 205368144 U | 7/2016 |
| CN | 105843452 A | 8/2016 |
| CN | 105859148 A | 8/2016 |
| CN | 106113837 A | 11/2016 |
| CN | 205687804 U | 11/2016 |
| CN | 106199812 A | 12/2016 |
| CN | 205818592 U | 12/2016 |
| CN | 106338783 A | 1/2017 |
| CN | 106378880 A | 2/2017 |
| CN | 106431004 A | 2/2017 |
| CN | 106941545 A | 7/2017 |
| CN | 107042642 A | 8/2017 |
| CN | 107174867 A | 9/2017 |

(56) References Cited

FOREIGN PATENT DOCUMENTS

| | | |
|---|---|---|
| CN | 107310209 A | 11/2017 |
| EP | 0698798 A2 | 2/1996 |
| EP | 1069088 A1 | 1/2001 |
| EP | 1275623 A1 | 1/2003 |
| EP | 1432874 A1 | 6/2004 |
| EP | 2149540 A1 | 2/2010 |
| EP | 3178796 A1 | 6/2017 |
| EP | 3822234 A1 | 5/2021 |
| FR | 2966934 A3 | 5/2012 |
| GB | 2485522 A | 5/2012 |
| ID | 11085 | 3/2011 |
| IN | 201201777 | 10/2015 |
| JP | 58-127463 A | 7/1983 |
| JP | 61-019888 A | 1/1986 |
| JP | 02-077434 A | 3/1990 |
| JP | 02-156448 A | 6/1990 |
| JP | 07-290652 A | 11/1995 |
| JP | 07-331115 A | 12/1995 |
| JP | 2000-121806 A | 4/2000 |
| JP | 2000-275404 A | 10/2000 |
| JP | 2001-281402 A | 10/2001 |
| JP | 2001-281406 A | 10/2001 |
| JP | 2001-311806 A | 11/2001 |
| JP | 2002-082207 A | 3/2002 |
| JP | 2002-210906 A | 7/2002 |
| JP | 2002-212317 A | 7/2002 |
| JP | 2003-026826 A | 1/2003 |
| JP | 2003-082127 A | 3/2003 |
| JP | 2004-069878 A | 3/2004 |
| JP | 2004-244594 A | 9/2004 |
| JP | 2004-291303 A | 10/2004 |
| JP | 2004-333901 A | 11/2004 |
| JP | 2005-042072 A | 2/2005 |
| JP | 2005-070724 A | 3/2005 |
| JP | 2005-187639 A | 7/2005 |
| JP | 2005-187640 A | 7/2005 |
| JP | 2005-227415 A | 8/2005 |
| JP | 2005-246296 A | 9/2005 |
| JP | 2005-300576 A | 10/2005 |
| JP | 2006-047504 A | 2/2006 |
| JP | 2006-110754 A | 4/2006 |
| JP | 2006-317957 A | 11/2006 |
| JP | 2006-352105 A | 12/2006 |
| JP | 2007-055064 A | 3/2007 |
| JP | 2007-072372 A | 3/2007 |
| JP | 2007-086521 A | 4/2007 |
| JP | 2007-114377 A | 5/2007 |
| JP | 2007-156205 A | 6/2007 |
| JP | 2007-240707 A | 9/2007 |
| JP | 2007-271953 A | 10/2007 |
| JP | 2007-298667 A | 11/2007 |
| JP | 2008-003425 A | 1/2008 |
| JP | 2008-116596 A | 5/2008 |
| JP | 2008-158156 A | 7/2008 |
| JP | 2009-025384 A | 2/2009 |
| JP | 2009-149468 A | 7/2009 |
| JP | 2009-175725 A | 8/2009 |
| JP | 2010-061044 A | 3/2010 |
| JP | 2010-125719 A | 6/2010 |
| JP | 2010-167410 A | 8/2010 |
| JP | 2011-246365 A | 12/2011 |
| JP | 2012-132022 A | 7/2012 |
| JP | 2012-228811 A | 11/2012 |
| JP | 2012-242837 A | 12/2012 |
| JP | 2013-070093 A | 4/2013 |
| JP | 2013-226666 A | 11/2013 |
| JP | 2013-234571 A | 11/2013 |
| JP | 2015-006650 A | 1/2015 |
| JP | 5650347 B1 | 1/2015 |
| JP | 5736214 B2 | 6/2015 |
| JP | 2015-167470 A | 9/2015 |
| JP | 2015-171770 A | 9/2015 |
| JP | 2016-009172 A | 1/2016 |
| JP | 2016-201236 A | 11/2016 |
| KR | 10-2006-0024545 A | 3/2006 |
| KR | 10-2006-0060171 A | 6/2006 |
| KR | 10-2006-0065724 A | 6/2006 |
| KR | 10-0709879 B1 | 4/2007 |
| KR | 10-2007-0054850 A | 5/2007 |
| KR | 10-2007-0063134 A | 6/2007 |
| KR | 10-2008-0048578 A | 6/2008 |
| KR | 10-2008-0057443 A | 6/2008 |
| KR | 10-2009-0098975 A | 9/2009 |
| KR | 10-2009-0119968 A | 11/2009 |
| KR | 10-2010-0013836 A | 2/2010 |
| KR | 10-2010-0123624 A | 11/2010 |
| KR | 2011-0047596 A | 5/2011 |
| KR | 10-2011-0078682 A | 7/2011 |
| KR | 10-1121207 B1 | 3/2012 |
| KR | 2013-0031689 A | 3/2013 |
| KR | 10-2014-0061842 A | 5/2014 |
| KR | 2015108266 * 10/2014 ............ C03C 17/34 |
| KR | 10-1517051 B1 | 5/2015 |
| KR | 10-2015-0116802 A | 10/2015 |
| KR | 10-2017-0028190 A | 3/2017 |
| KR | 10-2017-0043566 A | 4/2017 |
| WO | 02/00772 A1 | 1/2002 |
| WO | 03/09767 A1 | 2/2003 |
| WO | 03/27397 A1 | 4/2003 |
| WO | 2007/049589 A1 | 5/2007 |
| WO | 2008/062605 A1 | 5/2008 |
| WO | 2009/008240 A1 | 1/2009 |
| WO | 2009/037886 A1 | 3/2009 |
| WO | 2009/065490 A2 | 5/2009 |
| WO | 2010/114135 A1 | 10/2010 |
| WO | 2013/023359 A1 | 2/2013 |
| WO | 2014/061614 A1 | 4/2014 |
| WO | 2014/117333 A1 | 8/2014 |
| WO | 2015/015338 A2 | 2/2015 |
| WO | 2015/030118 A1 | 3/2015 |
| WO | 2015/084253 A1 | 6/2015 |
| WO | 2015/095288 A2 | 6/2015 |
| WO | 2015/108266 A1 | 7/2015 |
| WO | 2015/115154 A1 | 8/2015 |
| WO | 2015/137196 A1 | 9/2015 |
| WO | 2015/174625 A1 | 11/2015 |
| WO | 2015/190374 A1 | 12/2015 |
| WO | 2016/069113 A1 | 5/2016 |
| WO | 2016/204009 A1 | 12/2016 |
| WO | 2016/205317 A1 | 12/2016 |
| WO | 2017/041307 A1 | 3/2017 |
| WO | 2018/043253 A1 | 3/2018 |
| WO | 2018/125676 A1 | 7/2018 |
| WO | 2019/055745 A1 | 3/2019 |
| WO | 2020/013012 A1 | 1/2020 |
| WO | 2020/123367 A1 | 6/2020 |
| WO | 2022/011070 A1 | 1/2022 |
| WO | 2022/011071 A1 | 1/2022 |
| WO | 2022/125846 A1 | 6/2022 |

OTHER PUBLICATIONS

"Cieluv", Available at: https://en.wikipedia.org/wiki/CIELUV, 1976, 5 pages.
"Heron's formula", Available at: https://en.wikipedia.org/wiki/Heron%27s_formula, 8 pages.
"High-precision, fast array spectroradiometer—for demanding measurements", Available at: https://www.instrumentsystems.com/en/products/spectrometers/cas-140d, 4 pages.
"Illuminance Meters", Available at: https://sensing.konicaminolta.us/us/technologies/illuminance-meters/, 2 pages.
"Welcome to Display—Metrology & Systems", Available at: www.display-messtechnik.de/en/measurement, 2014, 1 page.
Al-Dahoudi, N. et al., "Transparent conducting, anti-static and anti-static-anti-glare coatings on plastic substrates," Thin Solid Films 2001, 392, pp. 299-304.
ASTM C770-16(2020), "Standard Test Method for Measurement of Glass Stress-Optical Coefficient," ASTM International, West Conshohocken, PA, 2020, www.astm.org.
ASTM D1003-21, "Standard Test Method for Haze and Luminous Transmittance of Transparent Plastics," ASTM International, West Conshohocken, PA, 2021, www.astm.org.

(56) References Cited

OTHER PUBLICATIONS

ASTM D523-14(2018), "Standard Test Method for Specular Gloss," ASTM International, West Conshohocken, PA, 2018, www.astm.org.

ASTM E2001-13, "Standard Guide for Resonant Ultrasound Spectroscopy for Defect Detection in Both Metallic and Non-metallic Parts," ASTM International, West Conshohocken, PA, 2013, www.astm.org.

Cecala, C. et al., "Fourier Optics Modeling of Display Sparkle from Anti-Glare Cover Glass: Comparison to Experimental Data," Imaging and Applied Optics Congress, OSA Technical Digest (Optical Society of America, 2020), paper JW5B.8, 2 pages.

Chou, S.Y. et al., "Imprint of Sub-25 nm Vias and Trenches in Polymers," Appl. Phys. Lett. 67, 3114, 1995, 3 pages.

Cook, R. L., "Stochastic sampling in computer graphics," Computer Graphics (Proceedings of ACM SIGGRAPH 86) 5, 1 (1986), pp. 51-72.

Kelley, E., "Proposed Diffuse Ambient Contrast Measurement Methods for Flat Panel Displays," 2001, NISTIR 6738, National Institute of Standards and Technology, Gaithersburg, Maryland, 7 pages.

Kittel, C., Introduction to Solid State Physics, seventh edition, John Wiley & Sons, Inc., NY, 1996, pp. 611-627.

Liu, B.T. et al., "Strength of the interactions between light-scattering particles and resins affects the haze of anti-glare films," Colloids Surf. A Physicochem. Eng. Aspects 2011, 389, pp. 138-143.

Modified ASTM D5767-18 test protocol, "Standard Test Method for Instrumental Measurement of Distinctness-of-Image (DOI) Gloss of Coated Surfaces using a Rhopoint IQ Gloss Haze & DOI Meter," Rhopoint Instruments Ltd.

Schlömer, T. et al., "Farthest-points optimized point sets with maximized minimum distance," Proc. ACM SIGGRAPH Symposium on high performance graphics: HPG 2011 pp. 135-142.

Shackelford, J.F., Introduction to Materials Science for Engineers, Sixth Edition, Pearson Prentice Hall, New Jersey, 2005, pp. 404-418.

Simonsen, et al., "Haze of random systems: an approximate analytic approach," Phys Rev A 79 063813 (2009), 23 pages.

Smart and Moore, Solid State Chemistry, An introduction, Chapman & Hall University and Professional Division, London, 1992, pp. 136-151.

Stillwell, A. et al., "Perception of Sparkle in Anti-Glare Display Screens," JSID 22(2), 129-136 (2014).

ASTM Standard Test Method for Haze and Luminous Transmittance of Transparent Plastics; Designation D 1003-07, Nov. 2007.

International Search Report and Written Opinion of the International Searching Authority; PCT/US2022/034624; dated Oct. 25, 2022; 11 pages; European Patent Office.

International Search Report and Written Opinion of the International Searching Authority; PCT/US2022/034812; dated Oct. 24, 2022; 12 pages; European Patent Office.

International Search Report and Written Opinion of the International Searching Authority; PCT/US2021/040772; dated Nov. 10, 2021; 10 pages; European Patent Office.

Boerner et al; "Holographic Antiglare and Antireflection Films for Flat Panel Displays" SID 03 Digest, 7.3, p. 68, 2003.

International Search Report and Written Opinion of the International Searching Authority; PCT/US2019/012807; Mailed Mar. 29, 2019; 12 Pages; European Patent Office.

Oliver et al; "An Improved Technique for Determining Hardness and Elastic Modulus Using Load and Displacement Sensing Indentation Experiments"; J. Mater. Res., vol. 7, No. 6, 1992, pp. 1564-1583.

Oliver et al; "Measurement of Hardness and Elastic Modulus by Instrument Indentation: Advances in Understanding and Refinements to Methodology" ;. J. Mater. Res., vol. 19, No. 1, 2004, pp. 3-20.

Taguchi et al; "Ultra-Low-Reflective 60-in. LCD With Uniform Moth-Eye Surface for Digital Signage," SID 10 Digest, 80.3, p. 1196, 2010.

\* cited by examiner

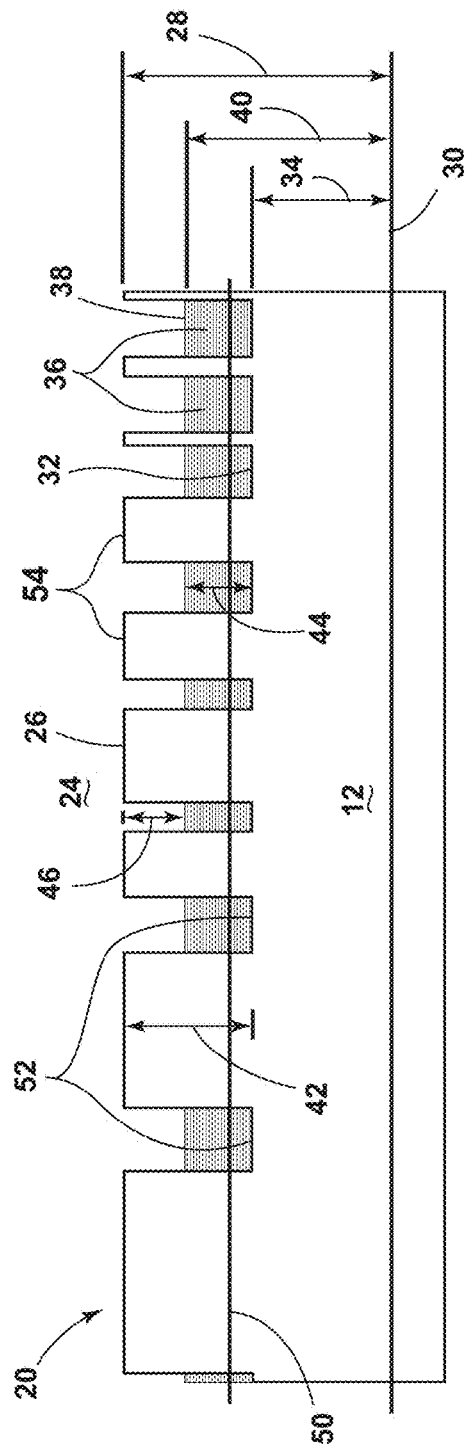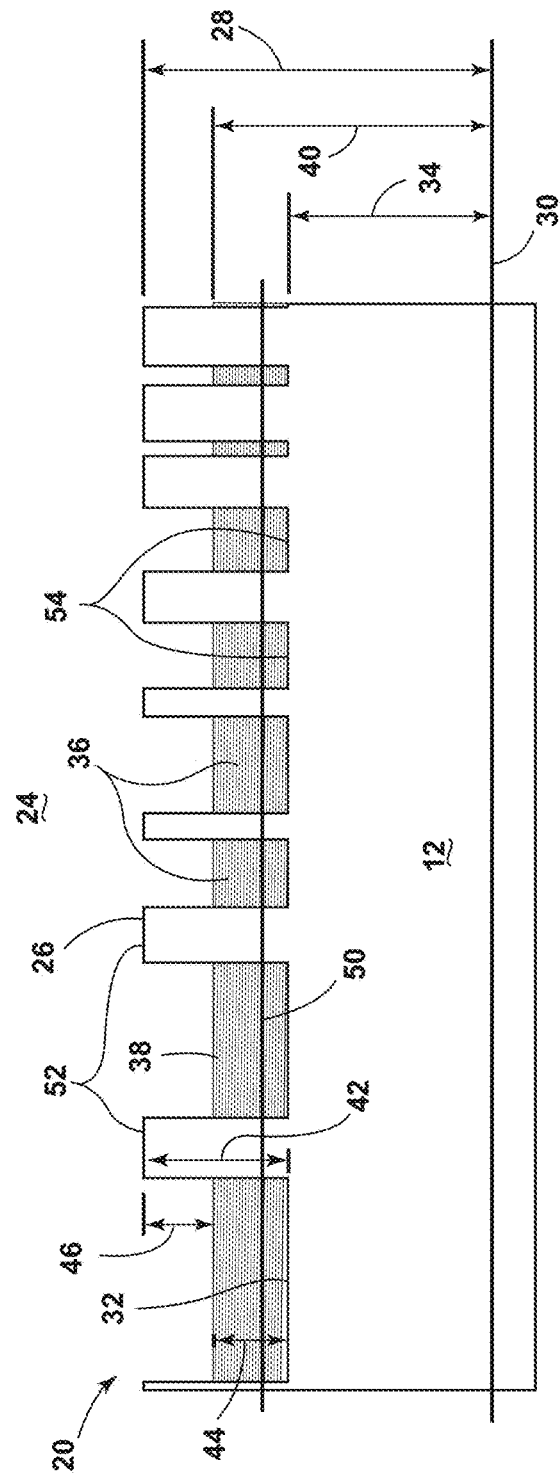
FIG. 3A
FIG. 3B

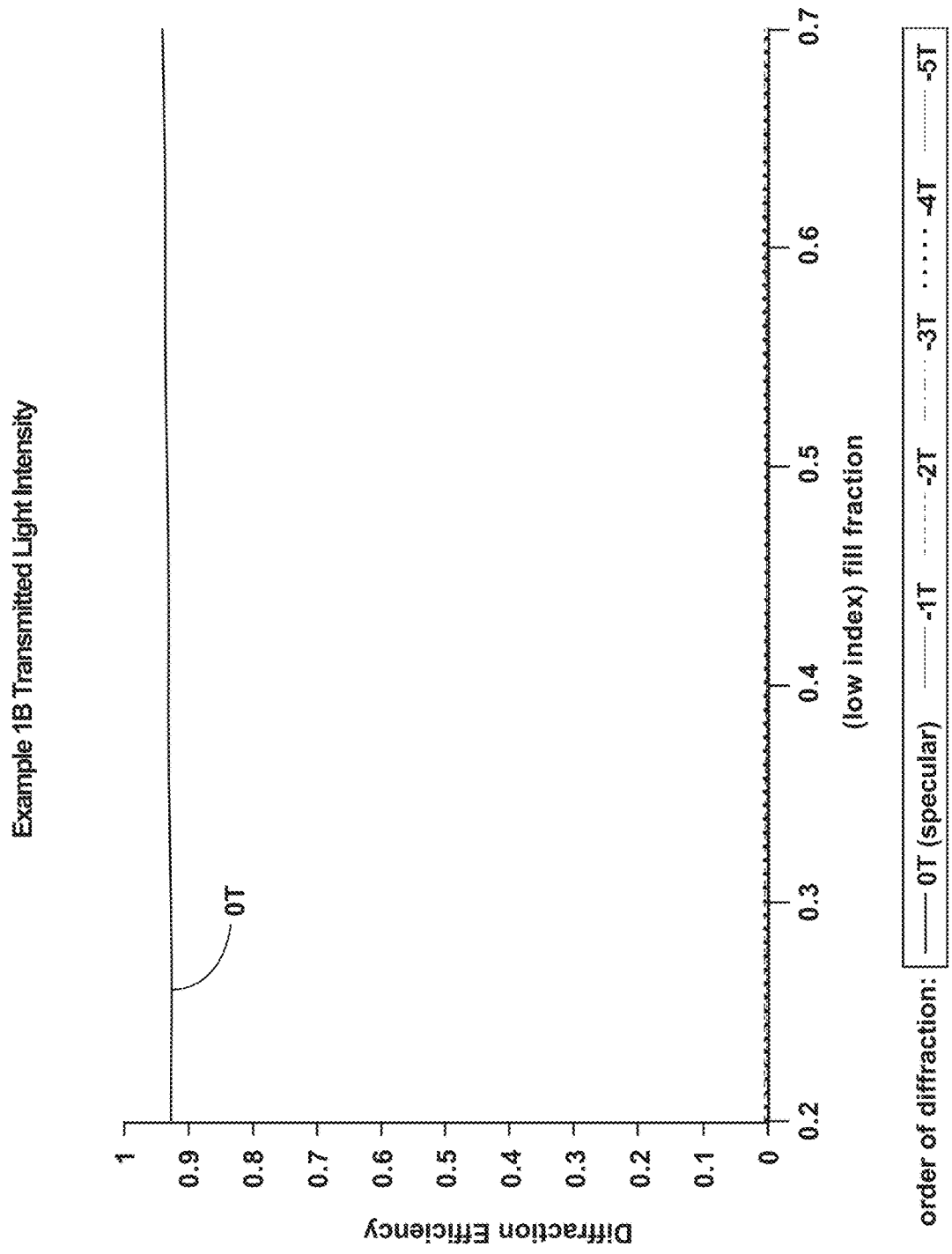

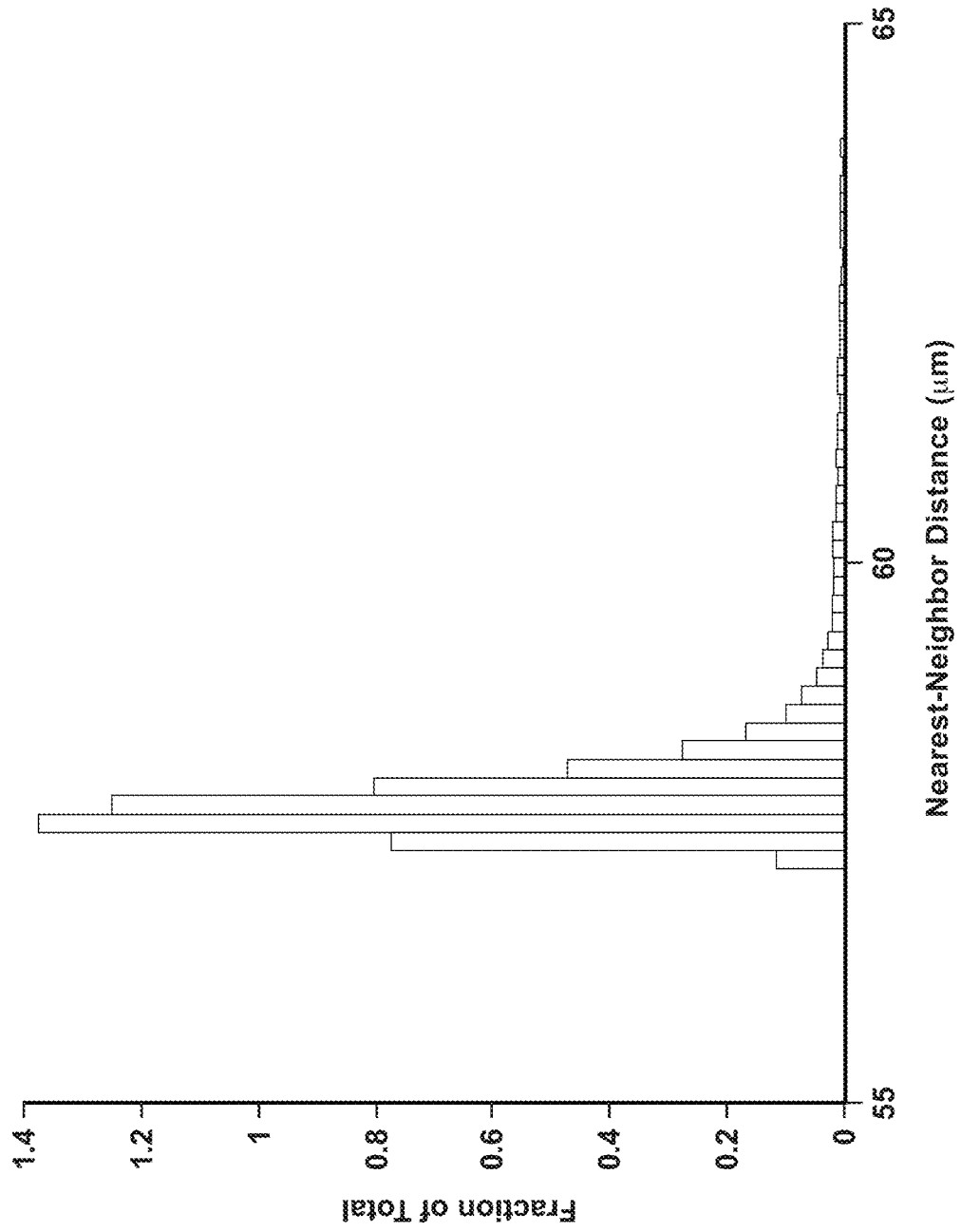

TEXTURED REGION TO REDUCE SPECULAR REFLECTANCE INCLUDING A LOW REFRACTIVE INDEX SUBSTRATE WITH HIGHER ELEVATED SURFACES AND LOWER ELEVATED SURFACES AND A HIGH REFRACTIVE INDEX MATERIAL DISPOSED ON THE LOWER ELEVATED SURFACES

CLAIM OF PRIORITY

This Application claims the benefit of priority to U.S. Provisional Application No. 63/049,843, filed Jul. 9, 2020, which is incorporated herein by reference in its entirety.

CROSS-REFERENCE TO RELATED APPLICATIONS

The present application relates to, but does not claim priority to, commonly owned and assigned U.S. patent application Ser. No. 17/369,301, entitled "ANTI-GLARE SUBSTRATE FOR A DISPLAY ARTICLE INCLUDING A TEXTURED REGION WITH PRIMARY SURFACE FEATURES AND SECONDARY SURFACE FEATURES IMPARTING A SURFACE ROUGHNESS THAT INCREASES SURFACE SCATTERING" and filed on Jul. 7, 2021; U.S. patent application Ser. No. 17/369,315, entitled "TEXTURED REGION OF A SUBSTRATE TO REDUCE SPECULAR REFLECTANCE INCORPORATING SURFACE FEATURES WITH AN ELLIPTICAL PERIMETER OR SEGMENTS THEREOF, AND METHOD OF MAKING THE SAME" and filed on Jul. 7, 2021; U.S. Patent Application Ser. No. 17/370311, entitled "DISPLAY ARTICLES WITH DIFFRACTIVE, ANTI-GLARE SURFACES AND THIN, DURABLE ANTIREFLECTION COATINGS" and filed on Jul. 8, 2021, now U.S. Pat. No. 11,977,206; and U.S. patent application Ser. No. 17/370,350, entitled "DISPLAY ARTICLES WITH ANTIGLARE SURFACES AND THIN, DURABLE ANTIREFLECTION COATINGS" and filed on July 8, 2021, now U.S. Pat. No. 11,971,519. The entire disclosures of each of the foregoing U.S. patent applications, publications and patent documents are incorporated herein by reference.

BACKGROUND

Substrates transparent to visible light are utilized to cover displays of display articles. Such display articles include smart phones, tablets, televisions, computer monitors, and the like. The displays are often liquid crystal displays, organic light emitting diodes, among others. The substrate protects the display, while the transparency of the substrate allows the user of the device to view the display.

The substrate reflecting ambient light, especially specular reflection, reduces the ability of the user to view the display through the substrate. Specular reflection in this context is the mirror-like reflection of ambient light off the substrate. For example, the substrate may reflect visible light reflecting off or emitted by an object in the environment around the device. The visible light reflecting off the substrate reduces the contrast of the light from the display transmitting to the eyes of the user through the substrate. At some viewing angles, instead of seeing the visible light that the display emits, the user sees a specularly reflected image. Thus, attempts have been made to reduce specular reflection of visible ambient light off of the substrate.

Attempts have been made to reduce specular reflection off of the substrate by texturing the reflecting surface of the substrate. The resulting surface is sometimes referred to as an "antiglare surface." For examples, sandblasting and liquid etching the surface of the substrate can texture the surface, which generally causes the surface to reflect ambient light diffusely rather than specularly. Diffuse reflection generally means that the surface still reflects the same intensity of ambient light but the texture of the reflecting surface scatters the light upon reflection. The more diffuse reflection interferes less with the ability of the user to see the visible light that the display emits.

Such methods of texturing (i.e., sandblasting and liquid etching) generate features on the surface with imprecise and unrepeatable geometry (the features provide the texture). The geometry of the textured surface of one substrate formed via sandblasting or liquid etching can never be exactly the same as the geometry of the textured surface of another substrate formed via sandblasting or liquid etching. Commonly, only a quantification of the surface roughness (i.e., $R_a$) of the textured surface of the substrate is a repeatable target of the texturing.

There are a variety of metrics by which the quality of the "antiglare" surface is judged. Those metrics include (1) the distinctness-of-image, (2) pixel power deviation, (3) apparent Moire interference fringes, (4) transmission haze, (5) specular reflection reduction, and (6) reflection color artifacts. Distinctness-of-image, which more aptly might be referred to as distinctness-of-reflected-image, is a measure of how distinct an image reflecting off the surface appears. The lower the distinctness-of-image, the more the textured surface is diffusely reflecting rather than specularly reflecting. Surface features can magnify various pixels of the display, which distorts the image that the user views. Pixel power deviation, also referred to as "sparkle," is a quantification of such an effect. The lower the pixel power deviation the better. Moiré interference fringes are large scale interference patterns, which, if visible, distort the image that the user sees. Preferably, the textured surface produces no apparent Moire interference fringes. Transmission haze is a measure of how much the textured surface is diffusing the visible light that the display emitted upon transmitting through the substrate. The greater the transmission haze, the less sharp the display appears (i.e., lowered apparent resolution). Specular reflection reduction is a measure of how well the anti-glare surface reduces specular reflection of ambient light compared to a baseline non-antiglare glass substrate. The greater the reduction of specular reflection compared to the baseline the better. Reflection color artifacts are a sort of chromatic aberration where the textured surface diffracts light upon reflection as a function of wavelength—meaning that the reflected light, although relatively diffuse, appears segmented by color. The less reflected color artifacts that the textured surface produces the better. Some of these attributes are discussed in greater detail below.

Targeting a specific surface roughness alone cannot optimize all of those metrics simultaneously. A relatively high surface roughness that sandblasting or liquid etching produces might adequately transform specular reflection into diffuse reflection. However, the high surface roughness can additionally generate high transmission haze and pixel power deviation. A relatively low surface roughness, while decreasing transmission haze, might fail to sufficiently transform specular reflection into diffuse reflection—defeating the "antiglare" purpose of the texturing.

Accordingly, a new approach to providing a textured region of the substrate is needed—one that is reproducible from substrate-to-substrate and one that causes the textured surface to reflect ambient light sufficiently diffusely rather than specularly so as to be "antiglare" (e.g., a low distinctness-of-image, low specular reflection) but simultaneously also delivers low pixel power deviation, low transmission haze, and low reflection color artifacts.

SUMMARY

The present disclosure provides a new approach that delivers, simultaneously, many desired anti-glare performance metrics. A textured region is formed at a primary surface of the substrate that includes the substrate providing surfaces at two distinct mean elevations, such as when surface features are etched or otherwise formed into the substrate. High-index material is then deposited on to the surfaces of the substrate at the lower of the two distinct mean elevation, but not so much high-index material as to reach the higher of the two distinct mean elevations of the substrate. The surface features can be randomly but specifically placed to allow reproducibility from substrate to substrate. The surface features can have characteristic dimensions that are tunable to provide the desired optical results. The presence of the high-index material generally reduces pixel power deviation, and the presence of the surface features effectively scatters light upon reflection resulting in low specular reflection.

According to a first aspect of the present disclosure, a substrate for a display article, the substrate comprising: (a) a primary surface; and (b) a textured region on at least a portion of the primary surface, the textured region comprising: (i) one or more higher surfaces residing at a higher mean elevation parallel to a base-plane disposed below the textured region and extending through the substrate; (ii) one or more lower surfaces residing at a lower mean elevation parallel to the base-plane that is less than the higher mean elevation; and (iii) a high-index material disposed on each of the one or more lower surfaces residing at the lower mean elevation, the high-index material forming one or more intermediate surfaces residing at an intermediate mean elevation parallel to the base-plane that is greater than the lower mean elevation but less than the higher mean elevation, the high-index material comprising an index of refraction that is greater than the index of refraction of the substrate or a low-index material providing the one or more higher surfaces.

According to a second aspect of the present disclosure, the substrate of the first aspect, wherein (i) the intermediate mean elevation of the high-index material is less than the higher mean elevation of the one or more higher surfaces by a distance within a range of 100 nm to 190 nm; (ii) the lower mean elevation of the one or more lower surfaces is less than the higher mean elevation of the one or more higher surfaces by a distance within a range of 220 nm to 370 nm; and (iii) the intermediate mean elevation of the high-index material is greater than the lower mean elevation of the one or more lower surfaces by a distance within a range of 100 nm to 200 nm.

According to a third aspect of the present disclosure, the substrate of any one of the first through second aspects, wherein (i) the index of refraction of the substrate or the low-index material is within a range of 1.4 to 1.6; and (ii) the index of refraction of the high-index material is within a range of 1.6 to 2.3.

According to a fourth aspect of the present disclosure, the substrate of any one of the first through third aspects, wherein the high-index material occupies 22% to 49% of an area of a plane that is (i) parallel to the base-plane and (ii) that extends through the high-index material, the area bound by the textured region.

According to a fifth aspect of the present disclosure, the substrate of any one of the first through fourth aspects, wherein the substrate comprises a glass substrate or glass-ceramic substrate.

According to a sixth aspect of the present disclosure, a substrate for a display article, the substrate comprising: (I) a primary surface; and (II) a textured region on at least a portion of the primary surface, the texture region comprising: (a) one or more higher surfaces residing at a higher mean elevation parallel to a base-plane disposed below the textured region and extending through the substrate; (b) one or more lower surfaces residing at a lower mean elevation parallel to the base-plane that is less than the higher mean elevation; (c) surface features projecting from or disposed within a surrounding portion at the primary surface, wherein (i) the surface features provide either the one or more higher surfaces or the one or more lower surfaces, (ii) the surrounding portion provides the other of the one or more higher surfaces or the one or more lower surfaces, whichever the surface features are not providing; and (d) a high-index material disposed on the one or more lower surfaces residing at the lower mean elevation, the high-index material comprising (i) an index of refraction that is greater than the index of refraction of the substrate or a low-index material providing the one or more higher surfaces and (ii) one or more intermediate surfaces residing at an intermediate mean elevation parallel to the base-plane that is between the higher mean elevation and the lower mean elevation.

According to a seventh aspect of the present disclosure, the substrate of the sixth aspect, wherein (i) the surface features are disposed within the surrounding portion; and (ii) the high-index material is disposed within each surface feature, on the one or more lower surfaces provided by the surface features residing at the lower mean elevation.

According to an eighth aspect of the present disclosure, the substrate of any one of the sixth through seventh aspects, wherein the intermediate mean elevation of the high-index material is less than the higher mean elevation of the one or more higher surfaces of by a distance within a range of 120 nm to 190 nm.

According to a ninth aspect of the present disclosure, the substrate of any one of the sixth through eighth aspects, wherein the lower mean elevation is less than the higher mean elevation by a distance within a range of 220 nm to 370 nm.

According to a tenth aspect of the present disclosure, the substrate of any one of the sixth through ninth aspects, wherein the intermediate mean elevation of the high-index material is greater than the lower mean elevation of the one or more lower surfaces by a distance within a range of 100 nm to 200 nm.

According to an eleventh aspect of the present disclosure, the substrate of any one of the sixth through tenth aspects, wherein the index of refraction of the substrate or the low-index material is within a range of 1.4 to 1.6.

According to an twelfth aspect of the present disclosure, the substrate of any one of the sixth through eleventh aspects, wherein the index of refraction of the high-index material is within a range of 1.6 to 2.3.

According to an thirteenth aspect of the present disclosure, the substrate of any one of the sixth through twelfth aspects, wherein (i) each surface feature has a perimeter parallel to the base-plane; and (ii) the perimeter of each surface feature is circular or elliptical.

According to an fourteenth aspect of the present disclosure, the substrate of any one of the sixth through twelfth aspects, wherein (i) each surface feature has a perimeter parallel to the base-plane; and (ii) the perimeter of each surface feature has a longest dimension within a range 5 μm to 200 μm.

According to a fifteenth aspect of the present disclosure, the substrate of any one of the sixth through fourteenth aspects, wherein an arrangement of the surface features do not repeat and instead reflect a random distribution.

According to a sixteenth aspect of the present disclosure, the substrate of any one of the sixth through fourteenth aspects, wherein the surface features are arranged in a random distribution with a minimum center-to-center distance separating each of the surface features.

According to a seventeenth aspect of the present disclosure, the substrate of any one of the sixth through sixteenth aspects, wherein the high-index material comprises $AlN_x$, $SiO_xN_y$, or $SiN_x$.

According to an eighteenth aspect of the present disclosure, the substrate of any one of the sixth through seventeenth aspects, wherein the high-index material occupies 22% to 49% of an area of a plane that is (i) parallel to the base-plane and (ii) that extends through the high-index material, the area bound by the textured region.

According to a nineteenth aspect of the present disclosure, the substrate of any one of the sixth through eighteenth aspects, wherein the substrate comprises a glass substrate or glass-ceramic substrate.

According to a twentieth aspect of the present disclosure, the substrate of any one of the sixth through nineteenth aspects, wherein (i) the textured region exhibits a pixel power deviation within a range of 1.2% to 2.1%; (ii) the textured region exhibits a transmission haze within a range of 1.5% to 2.5%; (iii) the textured region exhibits a specular reflectance of 0.5% to 1.75%; and (iv) the textured region exhibits a distinctness-of-image of 25% to 85%.

According to a twenty-first aspect of the present disclosure, a method of forming a textured region of a substrate for a display article, the method comprising: (a) forming surface features projecting from or disposed within a surrounding portion at a primary surface of a substrate according to a predetermined positioning of each surface feature, thus forming a textured region, wherein (i) one or more higher surfaces of the textured region residing at a higher mean elevation parallel to a base-plane disposed below the textured region and extending through the substrate, (ii) one or more lower surfaces of the textured region reside at a lower mean elevation parallel to the base-plane that is less than the higher mean elevation, (iii) the surface features provide either the one or more higher surfaces or the one or more lower surfaces, and (iv) the surrounding portion provides the other of the one or more higher surfaces or the one or more lower surfaces, whichever the surface features do not provide; and (b) depositing a high-index material on whichever of the surface features or the surrounding portion providing the one or more lower surfaces residing at the lower mean elevation, the high-index material comprising (i) an index of refraction that is greater than the index of refraction of the substrate and (ii) one or more intermediate surfaces residing at an intermediate mean elevation parallel to the base-plane that is between the higher mean elevation and the lower mean elevation.

According to a twenty-second aspect of the present disclosure, the method of the twenty-first aspect further comprises: determining the positioning of each surface feature utilizing a spacing distribution algorithm, thus establishing the predetermined positioning of each surface feature.

According to a twenty-third aspect of the present disclosure, the method of the twenty-second aspect further comprises: disposing an etching mask on the primary surface that either (i) prevents etching where the surface features are to be formed in accordance with the predetermined positioning of the surface features or (ii) allows etching only where the surface features are to be formed in accordance with the predetermined positioning of the surface features; wherein, forming the surface features comprises contacting at least the primary surface of the substrate with an etchant while the etching mask is disposed on the primary surface of the substrate.

According to a twenty-fourth aspect of the present disclosure, the method of the twenty-third aspect, wherein the high-index material is deposited while the etching mask is disposed on the primary surface and after the surface features have been formed.

According to a twenty-fifth aspect of the present disclosure, the method of the twenty-fourth aspect further comprising: after the high-index material has been deposited, removing the etching mask.

BRIEF DESCRIPTION OF THE DRAWINGS

In the figures:

FIG. 3A is an elevation view of a cross-section taken through line III-III of FIG. 2, illustrating the substrate providing surfaces residing at the higher mean elevation, surfaces residing at a lower mean elevation from the base-plane, and the high-index material disposed on the surfaces residing at the lower mean elevation, the high-index material providing surfaces residing at the intermediate mean elevation between the higher mean elevation and the lower mean elevation;

FIG. 3B is the same view as FIG. 3A, but illustrating a scenario where the surface features were not disposed within a surrounding portion of the substrate (as in FIG. 3A) but rather projected from the surrounding portion, and the high-index material is disposed on the surrounding portion;

FIG. 7C is a graph pertaining to Example 1B, illustrating diffraction efficiency of transmitted light through the textured region of the substrate as a function of the fill-fraction of the substrate (i.e., the percentage of a plane through the high-index material of the textured region that the substrate occupies);

FIG. 8 is a histogram pertaining to Examples 2A-2G, illustrating the center-to-center distance of objects randomly placed into an area (to assign placement of subsequently formed surface features of a textured region) via a spacing distribution algorithm.

DETAILED DESCRIPTION

Figure 1:
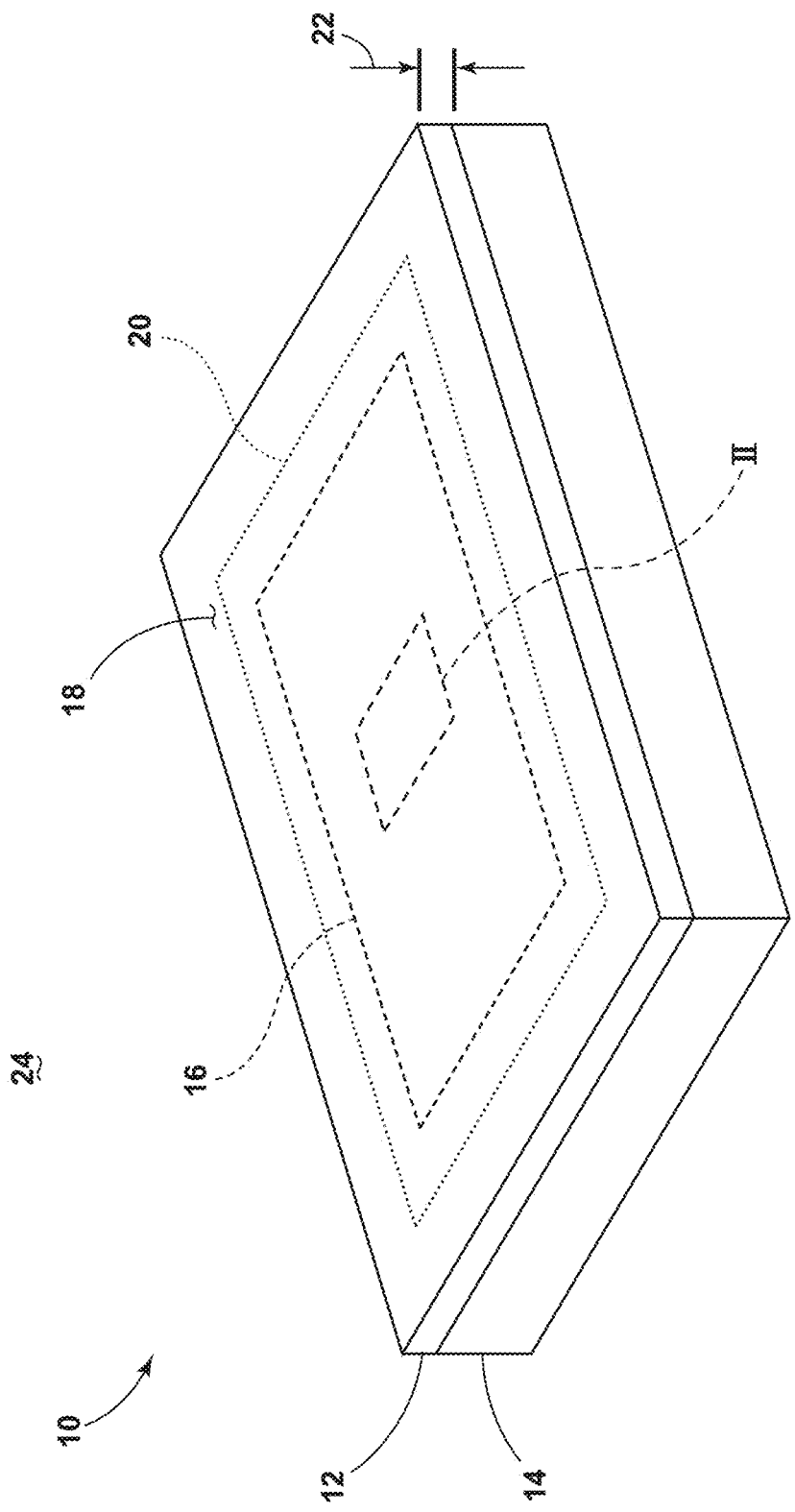
FIG. 1 is a perspective view of a display article of the present disclosure, illustrating a substrate with a textured region to reduce specular reflectance specular reflectance from light emitted from an external environment.

Referring now to FIG. 1, a display article 10 includes a substrate 12. In embodiments, the display article 10 further includes a housing 14 to which the substrate 12 is coupled and a display 16 within the housing 14. In such embodiments, the substrate 12 at least partially covers the display 16 such that light that the display 16 emits transmits through the substrate 12.

The substrate 12 includes a primary surface 18, a textured region 20 defined on the primary surface 18, and a thickness 22 that the primary surface 18 bounds in part. The primary surface 18 generally faces toward an external environment 24 surrounding the display article 10 and away from the display 16. The display 16 emits visible light that transmits through the thickness 22 of the substrate 12, out the primary surface 18, and into the external environment 24.

Figure 2:
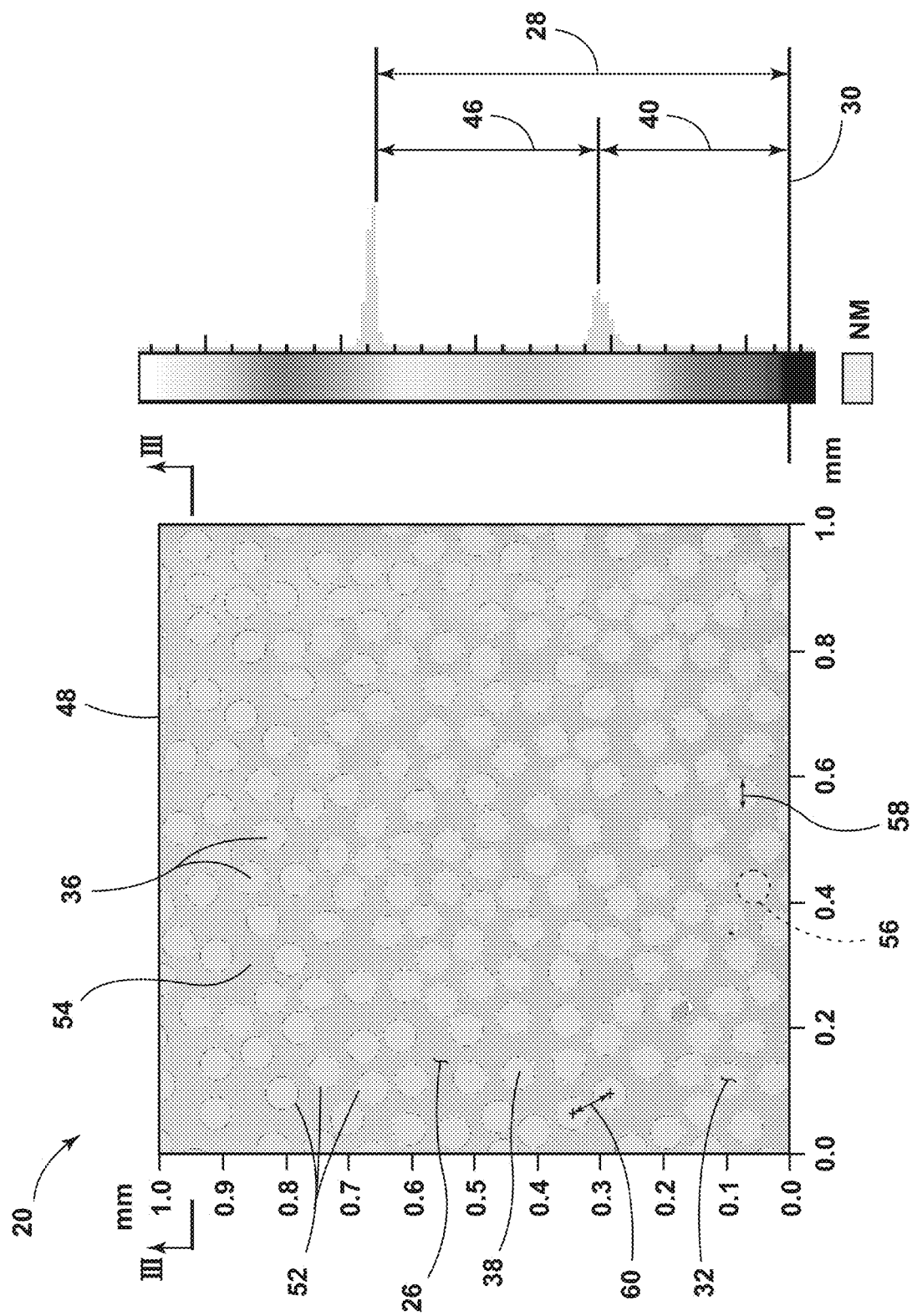
FIG. 2 is optical profilometer scan, pertaining to Examples 2A-2G, and also generally illustrating embodiments of the textured region including one or more surfaces at a higher mean elevation from a base-plane and high-index material deposited within surface features, the high-index material forming surfaces at an intermediate mean elevation from the base-plane.

Referring now to FIGS. 2-3B, in embodiments, the textured region 20 includes one or more higher surfaces 26 that face the external environment 24 and reside at a higher mean elevation 28. A base-plane 30 extends through the substrate 12 below the textured region 20. The higher mean elevation 28 is parallel to the base-plane 28. The base-plane 30 provides a conceptual reference point and is not a structural feature. Each of the one or more higher surfaces 26 resides at approximately the higher mean elevation 28, within manufacturing capabilities.

The textured region further includes one or more lower surfaces 32 that face the external environment 24 and reside at a lower mean elevation 34. The lower mean elevation 34 is parallel to the base-plane 28, and is less than the higher mean elevation 28. "Higher" and "lower" are thus terms to indicate relative elevation from the base-plane 28 respective to each other. Each of the one or more lower surfaces 32 resides at approximately the lower mean elevation 34, within manufacturing capabilities.

The substrate 12 or a low-index material disposed on the substrate 12 provides the one or more higher surfaces 26 of the textured region 20. In such embodiments, whichever of the substrate 12 or the low-index material that provides the one or more higher surfaces 26 has an index of refraction of 1.4, 1.5, 1.6, or within a range of 1.4 to 1.6. In embodiments, the substrate 12, regardless of whether the substrate 12 provides the one or more higher surfaces 26, has an index of refraction of 1.4, 1.5, 1.6, or within a range of 1.4 to 1.6. For purposes of this disclosure, any specific value for the index of refraction is for a wavelength of 589 nm and at a temperature of 25° C.

The textured region 20 further includes a high-index material 36. In embodiments, the high-index material 36 has a composition that is different than the composition of the substrate 12. The high-index material 36 is disposed on each of the one or more lower surfaces 32 of the textured region 20 residing at the lower mean elevation 34. The high-index material 36 forms one or more intermediate surfaces 38 that face that face the external environment 24 and reside at an intermediate mean elevation 40 parallel to the base-plane 30. Each of the one or more intermediate surfaces 38 resides at approximately the intermediate mean elevation 40, within manufacturing capabilities.

The high-index material 36 has an index of refraction. The index of refraction of the high-index material 36 is greater than the index of refraction of the substrate 12. In embodiments, the index of refraction of the high-index material 36 is 1.6, 1.7, 1.8, 1.9, 2.0, 2.01, 2.02, 2.03, 2.04, 2.05, 2.06, 2.07, 2.08, 2.09, 2.1, 2.2, 2.3, or within any range bound by any two of those values (e.g., 1.6 to 2.3, 1.8 to 2.2, 1.9 to 2.1, and so on). In embodiments, the high-index material is or includes $Si_uAl_vO_xN_y$, $Ta_2O_5$, $Nb_2O_5$, $AlN_x$, $Si_3N_4$, $AlO_xN_y$, $SiO_xN_y$, $SiN_x$, $SiN_x:H_y$, $HfO_2$, $TiO_2$, $ZrO_2$, $Y_2O_3$, $Al_2O_3$, $MoO_3$ and diamond-like carbon. In embodiments, the high-index material is or includes $AlN_x$, $SiO_xN_y$, or $SiN_x$. In embodiments, the high-index material is or includes $AlN_x$. Referring to the "$AlN_x$," "$AlO_xN_y$," "$SiO_xN_y$," and "$SiN_x$" materials in the disclosure, the subscripts allow those with ordinary skill in the art to reference these materials as a class of materials without specifying particular subscript values. The oxygen and nitrogen ratios can be adjusted through routine experimentation to tune the refractive index of the high-index material. $SiN_x$ with a composition close to $Si_3N_4$ may be preferred for embodiments where the film refractive index is desired to be high (e.g., greater than 1.8 or 1.9). $AlN_x$ with a composition close to $AlN$ may also be preferred for films with a similar high index. Minority fractions of oxygen or hydrogen (eg. 0-20 atomic %) can also be incorporated into these materials while achieving a similar high index range.

The intermediate mean elevation 40 of the one or more intermediate surfaces 38 of the high-index material 36 is greater than the lower mean elevation 34 of the one or more lower surfaces 32 of the textured region 20, but less than the higher mean elevation 28 of the one or more higher surfaces 26 of the textured region 20. In short, the intermediate mean elevation 40 lies between higher mean elevation 28 and the lower mean elevation 34.

The higher mean elevation 28 of the one or more higher surfaces 26 of the textured region 20 is greater than the lower mean elevation 34 of the one or more lower surfaces 32 of the textured region 20 by a distance 42. This disclosure may refer to the distance 42 as the "trench depth" (not to be confused with "air trench depth" discussed later). In embodiments, the distance 42 is 220 nm, 230 nm, 240 nm, 250 nm, 260 nm, 270 nm, 280 nm, 290 nm, 300 nm, 310 nm, 320 nm, 330 nm, 340 nm, 350 nm, 360 nm, or 370 nm, or any range bounded by any two of those values (e.g., 250 nm to 350 nm, 270 nm to 330 nm, 220 nm to 370 nm, and so on).

The intermediate mean elevation 40 of the high-index material 36 is greater than the lower mean elevation 34 of the one or more lower surfaces 32 of the textured region 20 by a distance 44. The distance 44 may be referred as the "height" or "thickness" of the high-index material 36 deposited upon the one or more lower surfaces 32. In embodiments, the distance 44 is 100 nm, 110 nm, 120 nm, 130 nm, 140 nm, 150 nm, 160 nm, 170 nm, 180 nm, 190 nm, or 200 nm, or within any range bound by any two of those values (e.g., 100 nm to 200 nm, 120 nm to 180 nm, and so on).

The intermediate mean elevation 40 of the high-index material 36 is less than the higher mean elevation 28 of the one or more higher surfaces 26 of the textured region 20 by a distance 46. This distance 46 might be referred to herein as an "air trench depth." In embodiments, the distance 46 is 100 nm, 110 nm, 120 nm, 125 nm, 130 nm, 140 nm, 150 nm, 160 nm, 170 nm, 180 nm, or 190 nm, or within any range bound by any two of those values (e.g., 120 nm to 190 nm, 125 nm to 190 nm, 130 nm to 180 nm, 100 nm to 190 nm, and so on). Note that FIGS. 3A and 3B are not to scale.

The high-index material 36 occupies a percentage of an area 48 of a plane 50 that (i) parallel to the base-plane 30 and (ii) that extends through the high-index material 36. The area 48 is bound by the textured region 20. In other words, the area 48 does not extend laterally beyond the textured region 20. The percentage of the area 48 of the plane 50 that the high-index material 36 occupies may be referred to herein as the "fill-fraction" of the high-index material 36. In embodiments, the fill-fraction of the high-index material 36 is 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, or 49%, or within any range bound by any two of those values (e.g., 44% to 45%, 22% to 49%, and so on). One hundred percent (100%) minus the fill-fraction of the high-index material 36 is a fill-fraction of the substrate 12 or low-index material deposited on the substrate 12 having the lower index of refraction than the high-index material 36.

It is believed that when the fill-fraction of the high-index material is 22% to 49%, then the specular reflectance and the intensive of the $1^{st}$ order diffraction peak are minimized. The high-index material 36, with the index of refraction that is higher than the index of refraction of the substrate 12 or low-index material, is more reflective. Thus, to maximize destructive interference upon reflection, the high-index material 36 should represent less than half of textured region 20 at the primary surface 18 reflecting the ambient light. Greater than half of the textured region 20 at the primary surface 18 reflecting the ambient light ought to be the substrate 12 or low-index material with the lower index of refraction to balance out the more reflective high-index material 36.

In embodiments, the textured region 20 includes surface features 52. In embodiments, the surface features 52 project from a surrounding portion 54 of the textured region 20 at the primary surface 18. Such surface features 52 take the form of pillars, ridges, and the like. In embodiments, the surface features 52 are disposed within (i.e., set into) the surrounding portion 54. Such surface features 52 take the form of blind-holes, channels, or mesas, into the thickness 22 of the substrate 12 or the low-index material from the surrounding portion 54. In embodiments, some of the surface features 52 are disposed within the surrounding portion 54 and some of the surface features 52 project from the surrounding portion 54. In embodiments, the surrounding portion 54 contiguously surrounds the surface features 52.

Either the surface features 52 or the surrounding portion 54 provides the one or more higher surfaces 26 residing at the higher mean elevation 28, while the other of the surface features 52 and the surrounding portion 54 provides the one or more lower surfaces 32 residing at the lower mean elevation 34. When the surface features 52 project from the surrounding portion 54 (see FIG. 3A), the surface features 52 provide the one or more higher surfaces 26 residing at the higher mean elevation 28. In such instances the surrounding portion 54 provides the one or more lower surfaces 32 residing at the lower mean elevation 34. When the surface features 52 are disposed within the surrounding portion 54 (see FIG. 3B), the surrounding portion 54 provides the one or more higher surfaces 26 residing at the higher mean elevation 28. In such instances the surface features 52 provides the one or more lower surfaces 32 residing at the lower mean elevation 34.

The high-index material 36 is disposed on whichever of the surface features 52 or the surrounding portion 64 provides the one or more lower surfaces 32 residing at the lower mean elevation 34. In embodiments where the surface features 52 are disposed within the surrounding portion 54, the high-index material 36 is disposed within the surface features 52, on the one or more lower surfaces 32 residing at the lower mean elevation 34 that the surface feature 52 provides. In embodiments where the surface features 52 project from the surrounding portion 54, the high-index material 36 is disposed between the surface features 52, on the one or more lower surfaces 32 residing at the lower mean elevation 34 that the surrounding portion 54 provides. In embodiments where the high-index material 36 is disposed on the surrounding portion 54, and the surrounding portion 54 is contiguous, the high-index material 36 can form one surface intermediate 38 that is contiguous around the surface features 52 projecting through the high-index material 36 toward the external environment 24.

In embodiments, the one or more higher surfaces 26 residing at the higher mean elevation 28 are planar. In embodiments, the one or more lower surfaces 32 residing at the lower mean elevation 34 are planar. In other embodiments, the one or more lower surfaces 32 are convex or concave. In embodiments, some of the one or more lower surfaces 32 are concave, while other of the one or more lower surfaces 32 are convex.

The textured region 20 providing the one or more higher surfaces 26 residing at higher mean elevation 28 and the one or more lower surfaces 32 residing at the lower mean elevation 34 is a diffractive structure that causes controlled scattering of reflected ambient light. The scattering of reflected ambient light lowers the specular reflectance and the distinctness-of-image. The high-index material 36 having the index of refraction that is greater than the index of refraction of the substrate 12 or low-index material on the substrate 12, as will be further shown, improves optical transmission through the textured region 20 (such as from the display 16), which lowers transmission haze and pixel power deviation compared to if only the textured region 20 without the high-index material 36 were utilized.

In embodiments, the surface features 52 are arranged in a random distribution. In other words, in those embodiments, the surface features 52 are not arranged in a pattern. However, in other embodiments, the surface features 52 are arranged in a pattern, such as arranged hexagonally. The textured region 20 can generate Moire fringe interference patterns upon reflecting ambient light, when the surface features 52 are arranged in a pattern. In addition, not arranging the surface features 52 in a pattern can reduce wavelength dependence of scattered ambient light. Thus, it may be beneficial to avoid arranging the surface features 52 in a pattern, for some applications.

Figure 4:
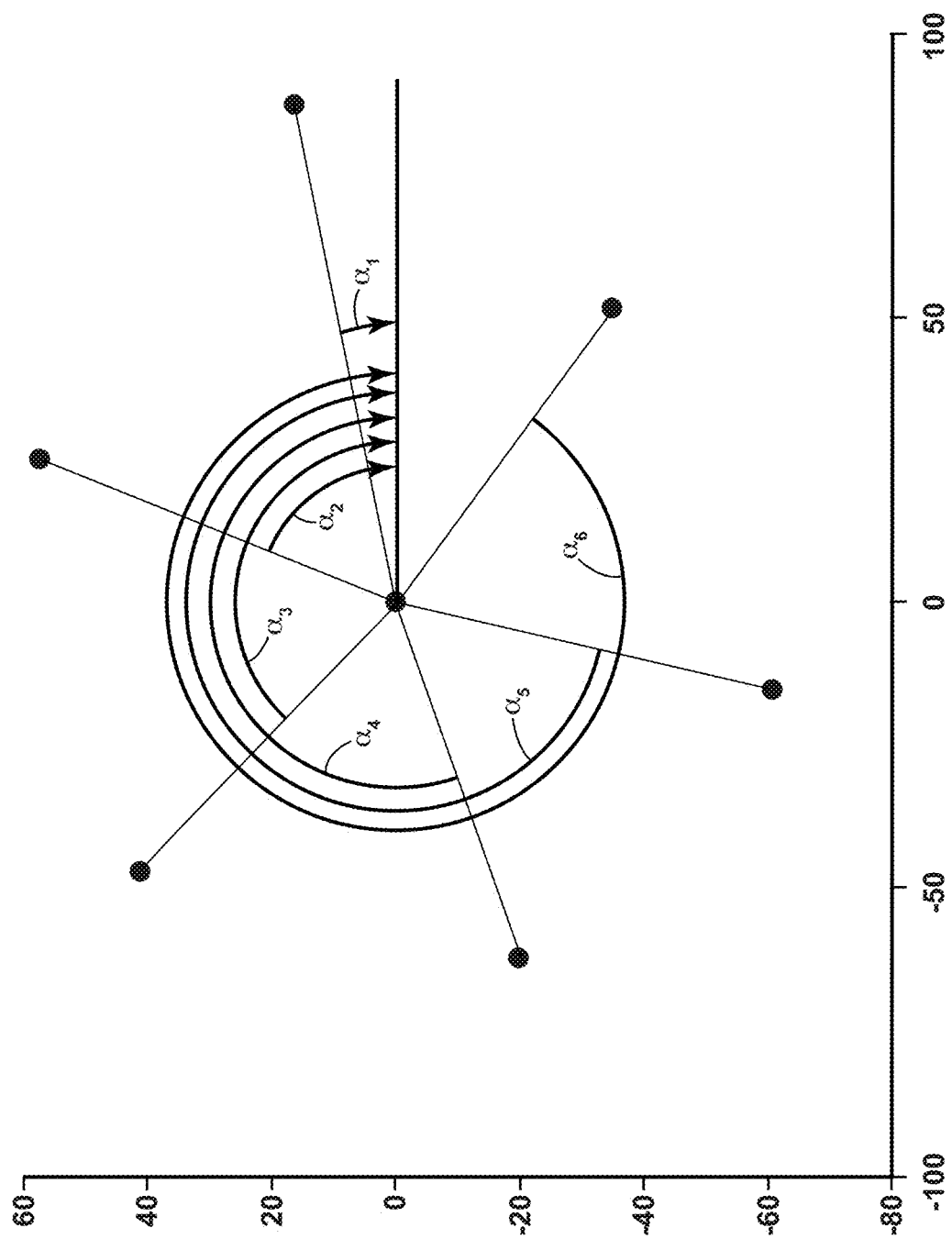
FIG. 4 is an illustration related to the calculation of hexagonality.

Referring to FIG. 4, one measure of randomness is the degree of hexagonality of the surface features 52. Hexagonality is a metric for quantifying locally how close an arrangement of objects in an area is to forming a hexagonal lattice. Each object in the area has a center point. For each center point in the area, the hexagonality H at that center point is computed using the angles of its six nearest neighbors with respect to an arbitrary axis, according to the equation below.

$$H = \frac{1}{6} \left| \sum_{k=1}^{6} e^{6i\alpha_k} \right| \in [0, 1]$$

The variables $\alpha_k$ represent the angles of the six nearest neighbors. On a hexagonal lattice, these six angles all differ by 60 degrees ($\pi/3$ radians), therefore the exponents in the six summands differ by $2\pi$ radians and the six complex numbers in the summation are all the same. In that case, H=1, a perfect hexagonal lattice. Each center point within the area has its only value for H. The mean of all the values for H within the area represents the deviation of the arrangement from a hexagonal lattice. The further the mean of all the values of H is from 1, the more random the arrangement is.

Each surface feature 52 has a perimeter 56 that is parallel to the base-plane 30. In embodiments, the perimeter 56 of each surface 52 has the same shape. For example, in embodiments, such as those illustrated at FIG. 2, the perimeter 56 of each surface feature 52 is circular. In embodiments, the perimeter 56 of each surface feature 52 is elliptical. In embodiments, the perimeter 56 of each surface feature 52 is hexagonal or polygonal. In embodiments, the perimeters 56 of the surface features 52 are one of two or more shapes (e.g., some are elliptical and some are circular).

The perimeter 56 of each surface feature 52 has a longest dimension 58. If the perimeter 52 is circular, then the longest dimension 58 is the diameter of the perimeter 56. If the perimeter 56 is hexagonal, then the longest dimension 58 is the major axis (long diagonal). And so on. In embodiments, the longest dimension 58 of the perimeter 56 of each surface feature 52 is 5 µm, 10 µm, 20 µm, 30 µm, 40 µm, 50 µm, 60 µm, 70 µm, 80 µm, 90 µm, 100 µm, 110 µm, 120 µm, 130 µm, 140 µm, 150 µm, 160 µm, 170 µm, 180 µm, 190 µm, or 200 µm, or within any range bounded by any two of those values (e.g., 5 µm to 200 µm, 20 µm to 100 µm, 80 µm to 120 µm, 30 µm to 70 µm, 25 µm to 75 µm, and so on).

In embodiments, a minimum center-to-center distance 60 separates the surface features 52. For example, if the minimum center-to-center distance 60 is 100 µm, then the center of one surface feature 52 can be separated from the center of another adjacent surface feature 52 by 100 µm or more than 100 µm but not less than 100 µm. In embodiments, the minimum center-to-center distance 60 is 5 µm, 10 µm, 20 µm, 30 µm, 40 µm, 50 µm, 60 µm, 70 µm, 80 µm, 90 µm, 100 µm, 110 µm, 120 µm, or 130 µm, or within any range bound by any two of those values (e.g., 30 µm to 70 µm, 40 µm to 80 µm, 5 µm to 100 µm, 20 µm to 90 µm, 30 µm to 80 µm, and so on).

The high-index material 36 having the index of refraction that is greater than the index of refraction of the substrate 12 or low-index material on the substrate 12 lowers the pixel power deviation that the textured region 20 generates, which allows the minimum center-to-center 60 spacing to be greater than it otherwise could be without the high-index material 36 incorporated. In addition, the incorporation of the high-index material 36 allows the surface features 52 to have longer longest dimension 58 than would otherwise be feasible without the high-index material 36. This is beneficial for several reasons. First, the longer the longest dimension 58 of the surface feature 52, the easier it is to fabricate the surface features 52 and thus the textured region 20. With incorporation of the high-index material 36, low-cost methods such as inkjet printing, screen printing, or gravure offset printing are available to fabricate the textured region 20. Second, the longer the longest dimension 58 of the perimeters 56 of the surface features 52, the less transmission haze the textured region 20 generates. However, there is a practical limit to the longest dimension 58 of the surface features 52, because if the longest dimension 58 is long enough, then the surface features 52 become visible to the human eye, which may be undesirable.

Third, when the longest dimension 58 of the perimeters 56 of the surface features 52 are sufficiently long, the surface features 52 scatter a higher intensity of the reflected light in a narrow angular range, including near 0.3 degrees from the specular angle. This results in the textured region 20 generating a higher pixel power deviation. In addition, this results in less reflected color artifacts, because the reflected light is not being scattered across a wide enough angular range to allow for human eyes to distinguish between the colors. For example, the angular separation between the peak scattering angles for the 450 nm wavelength portion of the light and 650 nm wavelength portion of light may be less than 0.4 degrees, less than 0.3 degrees, or even less than 0.2 degrees. Smaller angular separation between different wavelengths is preferred, because the human eye has difficulty resolving very small angular separation, so less color in the scattered light is visible to an observer with small angular scattering separation between wavelengths.

In embodiments, the substrate 12 includes a glass or glass-ceramic. In embodiments, the substrate 12 is a multi-component glass composition having about 40 mol % to 80 mol % silica and a balance of one or more other constituents, e.g., alumina, calcium oxide, sodium oxide, boron oxide, etc. In some implementations, the bulk composition of the substrate 12 is selected from the group consisting of aluminosilicate glass, a borosilicate glass, and a phosphosilicate glass. In other implementations, the bulk composition of the substrate 12 is selected from the group consisting of aluminosilicate glass, a borosilicate glass, a phosphosilicate glass, a soda lime glass, an alkali aluminosilicate glass, and an alkali aluminoborosilicate glass. In further implementations, the substrate 12 is a glass-based substrate, including, but not limited to, glass-ceramic materials that comprise a glass component at about 90% or greater by weight and a ceramic component. In other implementations of the display article 10, the substrate 12 can be a polymer material, with durability and mechanical properties suitable for the development and retention of the textured region 20. In other embodiments, the substrate 12 is or includes a single crystal structure such as sapphire.

In embodiments, the substrate 12 has a bulk composition that comprises an alkali aluminosilicate glass that comprises alumina, at least one alkali metal and, in some embodiments, greater than 50 mol % $SiO_2$, in other embodiments, at least 58 mol % $SiO_2$, and in still other embodiments, at least 60 mol % $SiO_2$, wherein the ratio ($Al_2O_3$ (mol %)+$B_2O_3$ (mol %))/Σ alkali metal modifiers (mol %)>1, where the modifiers are alkali metal oxides. This glass, in particular embodiments, comprises, consists essentially of, or consists of: about 58 mol % to about 72 mol % $SiO_2$; about 9 mol % to about 17 mol % $Al_2O_3$; about 2 mol % to about 12 mol % $B_2O_3$; about 8 mol % to about 16 mol % $Na_2O$; and 0 mol % to about 4 mol % $K_2O$, wherein the ratio ($Al_2O_3$ (mol %) +$B_2O_3$ (mol %))/Σ alkali metal modifiers (mol %)>1, where the modifiers are alkali metal oxides.

In embodiments, the substrate 12 has a bulk composition that comprises an alkali aluminosilicate glass comprising, consisting essentially of, or consisting of: about 61 mol % to about 75 mol % $SiO_2$; about 7 mol % to about 15 mol % $Al_2O_3$; 0 mol % to about 12 mol % $B_2O_3$; about 9 mol % to about 21 mol % $Na_2O$; 0 mol % to about 4 mol % $K_2O$; 0 mol % to about 7 mol % MgO; and 0 mol % to about 3 mol % CaO.

In embodiments, the substrate 12 has a bulk composition that comprises an alkali aluminosilicate glass comprising, consisting essentially of, or consisting of: about 60 mol % to about 70 mol % $SiO_2$; about 6 mol % to about 14 mol % $Al_2O_3$; 0 mol % to about 15 mol % $B_2O_3$; 0 mol % to about 15 mol % $Li_2O$; 0 mol % to about 20 mol % $Na_2O$; 0 mol % to about 10 mol % $K_2O$; 0 mol % to about 8 mol % MgO; 0 mol % to about 10 mol % CaO; 0 mol % to about 5 mol % $ZrO_2$; 0 mol % to about 1 mol % $SnO_2$; 0 mol % to about 1 mol % $CeO_2$; less than about 50 ppm $As_2O_3$; and less than about 50 ppm $Sb_2O_3$; wherein 12 mol %≤$Li_2O$+$Na_2O$+$K_2O$≤20 mol % and 0 mol %≤MgO+CaO≤10 mol %.

In embodiments, the substrate 12 has a bulk composition that comprises an alkali aluminosilicate glass comprising, consisting essentially of, or consisting of: about 64 mol % to about 68 mol % $SiO_2$; about 12 mol % to about 16 mol % $Na_2O$; about 8 mol % to about 12 mol % $Al_2O_3$; 0 mol % to about 3 mol % $B_2O_3$; about 2 mol % to about 5 mol % $K_2O$; about 4 mol % to about 6 mol % MgO; and 0 mol % to about 5 mol % CaO, wherein: 66 mol %≤$SiO_2$+$B_2O_3$+CaO≤69 mol %; $Na_2O$+$K_2O$+$B_2O_3$+MgO+CaO+SrO>10 mol %; 5 mol %≤MgO+CaO+SrO≤8 mol %; ($Na_2O$+$B_2O_3$)—$Al_2O_3$≤2 mol %; 2 mol %≤$Na_2O$—$Al_2O_3$≤6 mol %; and 4 mol %≤($Na_2O$+$K_2O$)—$Al_2O_3$≤10 mol %.

In embodiments, the substrate 12 has a bulk composition that comprises $SiO_2$, $Al_2O_3$, $P_2O_5$, and at least one alkali metal oxide ($R_2O$), wherein 0.75>[($P_2O_5$ (mol %)+$R_2O$ (mol %))/$M_2O_3$ (mol %)]≤1.2, where $M_2O_3$=$Al_2O_3$+$B_2O_3$. In embodiments, [($P_2O_5$ (mol %)+$R_2O$ (mol %))/$M_2O_3$ (mol %)]=1 and, in embodiments, the glass does not include $B_2O_3$ and $M_2O_3$=$Al_2O_3$. The substrate 12 comprises, in embodiments: about 40 to about 70 mol % $SiO_2$; 0 to about 28 mol % $B_2O_3$; about 0 to about 28 mol % $Al_2O_3$; about 1 to about 14 mol % $P_2O_5$; and about 12 to about 16 mol % $R_2O$. In some embodiments, the glass substrate comprises: about 40 to about 64 mol % $SiO_2$; 0 to about 8 mol % $B_2O_3$; about 16 to about 28 mol % $Al_2O_3$; about 2 to about 12 mol % $P_2O_5$; and about 12 to about 16 mol % $R_2O$. The substrate 12 may further comprise at least one alkaline earth metal oxide such as, but not limited to, MgO or CaO.

In some embodiments, the substrate 12 has a bulk composition that is substantially free of lithium; i.e., the glass comprises less than 1 mol % $Li_2O$ and, in other embodiments, less than 0.1 mol % $Li_2O$ and, in other embodiments, 0.01 mol % $Li_2O$, and in still other embodiments, 0 mol % $Li_2O$. In some embodiments, such glasses are free of at least one of arsenic, antimony, and barium; i.e., the glass comprises less than 1 mol % and, in other embodiments, less than 0.1 mol %, and in still other embodiments, 0 mol % of $As_2O_3$, $Sb_2O_3$, and/or BaO.

In embodiments, the substrate 12 has a bulk composition that comprises, consists essentially of or consists of a glass composition, such as Corning® Eagle XG® glass, Corning® Gorilla® glass, Corning® Gorilla® Glass 2, Corning® Gorilla® Glass 3, Corning® Gorilla® Glass 4, or Corning® Gorilla® Glass 5.

In embodiments, the substrate 12 has an ion-exchangeable glass composition that is strengthened by either chemical or thermal means that are known in the art. In embodiments, the substrate 12 is chemically strengthened by ion exchange. In that process, metal ions at or near the primary surface 18 of the substrate 12 are exchanged for larger metal ions having the same valence as the metal ions in the substrate 12, The exchange is generally carried out by contacting the substrate 12 with an ion exchange medium, such as, for example, a molten salt bath that contains the larger metal ions. The metal ions are typically monovalent metal ions, such as, for example, alkali metal ions. In one non-limiting example, chemical strengthening of a substrate 12 that contains sodium ions by ion exchange is accomplished by immersing the substrate 12 in an ion exchange bath comprising a molten potassium salt, such as potassium nitrate ($KNO_3$) or the like. In one particular embodiment, the ions in the surface layer of the substrate 12 contiguous with the primary surface 18 and the larger ions are monovalent alkali metal cations, such as $Li^+$ (when present in the glass), $Na^+$, $K^+$, $Rb^+$, and $Cs^+$. Alternatively, monovalent cations in the surface layer of the substrate 12 may be replaced with monovalent cations other than alkali metal cations, such as $Ag^+$ or the like.

In such embodiments, the replacement of small metal ions by larger metal ions in the ion exchange process creates a compressive stress region in the substrate 12 that extends from the primary surface 18 to a depth (referred to as the "depth of layer") that is under compressive stress. This compressive stress of the substrate 12 is balanced by a tensile stress (also referred to as "central tension") within the interior of the substrate 12, In some embodiments, the primary surface 18 of the substrate 12 described herein, when strengthened by ion exchange, has a compressive stress of at least 350 MPa, and the region under compressive stress extends to a depth, i.e., depth of layer, of at least 15 μm below the primary surface 18 into the thickness 22.

Ion exchange processes are typically carried out by immersing the substrate 12 in a molten salt bath containing the larger ions to be exchanged with the smaller ions in the glass. It will be appreciated by those skilled in the art that parameters for the ion exchange process, including, but not limited to, bath composition and temperature, immersion time, the number of immersions of the glass in a salt bath (or baths), use of multiple salt baths, additional steps such as annealing, washing, and the like, are generally determined by the composition of the glass and the desired depth of layer and compressive stress of the glass as a result of the strengthening operation. By way of example, ion exchange of alkali metal-containing glasses may be achieved by immersion in at least one molten bath containing a salt, such as, but not limited to, nitrates, sulfates, and chlorides, of the larger alkali metal ion. The temperature of the molten salt bath typically is in a range from about 380° C. up to about 450° C., while immersion times range from about 15 minutes up to about 16 hours. However, temperatures and immersion times different from those described above may also be used, Such ion exchange treatments, when employed with a substrate 12 having an alkali aluminosilicate glass composition, result in a compressive stress region having a depth (depth of layer) ranging from about 10 μm up to at least 50 μm, with a compressive stress ranging from about 200 MPa up to about 800 MPa, and a central tension of less than about 100 MPa.

As the etching processes that can be employed to create the textured region 20 of the substrate 12 can remove alkali metal ions from the substrate 12 that would otherwise be replaced by a larger alkali metal ion during an ion exchange process, a preference exists for developing the compressive stress region in the display article 10 after the formation and development of the textured region 20.

In embodiments, the textured region 20 exhibits a pixel power deviation ("PPD"). The details of a measurement system and image processing calculation used to obtain PPD values described in U.S. Pat. No. 9,411,180 entitled "Apparatus and Method for Determining Sparkle," and the salient portions of which are related to PPD measurements are incorporated by reference herein in their entirety. Further, unless otherwise noted, the SMS-1000 system (Display-Messtechnik & Systeme GmbH & Co. KG) is employed to generate and evaluate the PPD measurements of this disclosure. The PPD measurement system includes: a pixelated source comprising a plurality of pixels (e.g., a Lenovo Z50 140 ppi laptop), wherein each of the plurality of pixels has referenced indices i and j; and an imaging system optically disposed along an optical path originating from the pixelated source. The imaging system comprises: an imaging device disposed along the optical path and having a pixelated sensitive area comprising a second plurality of pixels, wherein each of the second plurality of pixels is referenced with indices m and n; and a diaphragm disposed on the optical path between the pixelated source and the imaging device, wherein the diaphragm has an adjustable collection angle for an image originating in the pixelated source. The image processing calculation includes: acquiring a pixelated image of the transparent sample, the pixelated image comprising a plurality of pixels; determining boundaries between adjacent pixels in the pixelated image; integrating within the boundaries to obtain an integrated energy for each source pixel in the pixelated image; and calculating a standard deviation of the integrated energy for each source pixel, wherein the standard deviation is the power per pixel dispersion. As used herein, all PPD values, attributes and limits are calculated and evaluated with a test set-up employing a display device having a pixel density of 140 pixels per inch (PPI). In embodiments, the display article 10 exhibits a PPD of 1.2%, 1.3%, 1.4%, 1.5%, 1.6%, 1.7%, 1.8%, 1.9%, 2.0%, 2.1%, or within any range bounded by any two of those values (e.g., 1.2% to 2.1%, and so on). In embodiments, the textured region 20 exhibits a PPD of less than less than 4%, less than 3%, less than 2.5%, less than 2.1%, less than 2.0%, less than 1.75%, or even less than 1.5%.

The textured region 20 of the present disclosure generating such low pixel power deviation values means that the display 16 of the display article 10 can have higher than normal resolution. As mentioned in the preceding paragraph, pixel power deviation values are determined with an industry-standard display with a resolution of 140 pixels per inch ("ppi"). The textured region 20 of the disclosure can transmit such resolution with low pixel power deviation. Thus, the resolution of the display 16 can be increased. In embodiments, the display 16 of the display article 10 has a resolution of greater than 140 ppi, such as a resolution within a range of 140 ppi to 300 ppi.

In embodiments, the textured region 20 exhibits a distinctness-of-image ("DOI"). As used herein, "DOI" is equal to $100*(R_S-R_{0.3^+})/R_S$, where $R_S$ is the specular reflectance flux measured from incident light (at 20° from normal) directed onto the textured region 20, and $R_{0.3}$ is the reflectance flux measured from the same incident light at 0.3° from the specular reflectance flux, $R_S$. Unless otherwise noted, the DOI values and measurements reported in this disclosure are obtained according to the ASTM D5767-18, entitled "Standard Test Method for Instrumental Measurement of Distinctness-of-Image (DOI) Gloss of Coated Surfaces using a Rhopoint IQ Gloss Haze & DOI Meter" (Rhopoint Instruments Ltd.). In addition, the DOI measurements were taken while the back surface of the substrate 12 (opposite side as the primary surface 18) was coupled to an absorber to remove reflections off the back surface. Thus, the DOI values here are "coupled" or "first-surface" values. In embodiments, the textured region 20 exhibits a distinctness-of-image ("DOI") of 25%, 30%, 35%, 40%, 45%, 50%, 55%, 60%, 65%, 70%, 75%, 80%, or 85%, or within any range bounded by any two of those values (e.g., 25% to 85%, and so on). In embodiments, the textured region 20 exhibits a distinctness-of-image of less than 90%, less than 80%, less than 70%, less than 60%, less than 50%, less than 40%, less than 35%, or even less than 30%.

In embodiments, the textured region 20 exhibits a transmission haze. As used herein, the term "transmission haze" refers to the percentage of transmitted light scattered outside an angular cone of about ±2.5° in accordance with ASTM D1003, entitled "Standard Test Method for Haze and Luminous Transmittance of Transparent Plastics," the contents of which are incorporated by reference herein in their entirety. In the examples, transmission haze was measured using a BYK Gardner Haze-Gard Plus, and incident light was at normal incidence (zero degrees) and using an integrating sphere detector system. Note that although the title of ASTM D1003 refers to plastics, the standard has been applied to substrates comprising a glass material as well. For an optically smooth surface, transmission haze is generally close to zero. In embodiments, the textured region 20 exhibits a transmission haze of 1.5%, 1.6%, 1.7%, 1.8%, 1.9%, 2.0%, 2.1%, 2.2%, 2.3%, 2.4%, or 2.5%, or within any range bounded by any two of those values (e.g., 1.5% to 2.5%, and so on). In embodiments, the textured region 20 exhibits a transmission haze of less than 20%, less than 10%, less than 5%, less than 3%, less than 2.5%, or less than 2.0%.

In embodiments, the textured region 20 exhibits a specular reflectance of 0.5%, 0.6%, 0.7%, 0.8%, 0.9%, 1.0%, 1.1%, 1.2%, 1.3%, 1.4%, 1.5%, 1.6%, 1.7%, 1.75%, or within any range bounded by any two of those values (e.g., 0.5% to 1.75%, and so on). Specular reflectance herein was determined using a Rhopoint IQ Gloss Haze & DOI Meter" (Rhopoint Instruments Ltd.), with a reflected incidence angle of 20 degrees, and while the back-surface of the substrate 12 is coupled to an absorber to remove back-surface reflectance. Values that this instrument reports are in gloss units (GU), normalized to a value of 100 GU for a black glass control sample having an index of refraction of 1.567 and a known primary surface reflectance value of 4.91% at 20 degrees angle of incidence. Thus, the specular reflectance values mentioned here represent conversion of the value that the instrument generated to absolute first-surface specular reflectance (in percent) according to the equation by multiplying the instrument-generated value by 0.0491.

In embodiments, the textured region 20 exhibits a transmittance over the optical wavelength regime in the range from about 400 nm to about 800 nm of 85%, 86%, 87%, 88%, 89%, 90%, 91%, 92%, 93%, 94%, or 95%, or within any range bound by any two of those values (e.g., 85% to 95%, 90% to 92%, and so on). As used herein, the term "transmittance" is defined as the percentage of incident optical power within a given wavelength range transmitted through the substrate 12 and out the textured region 20. Transmittance in the examples was measured using a BYK Gardner Haze-Gard Plus, using incident light at normal incidence (0 degrees) and integrating sphere detector system. Reported transmittance is total transmittance for all output angles.

In embodiments, the textured region 20 simultaneously exhibits (i) a pixel power deviation within a range of 1.2% to 2.1%, (ii) a transmission haze within a range of 1.5% to 2.5%, (iii) a specular reflectance of 0.5% to 1.75%, and (iv) a distinctness-of-image of 25% to 85%.

Figure 5:
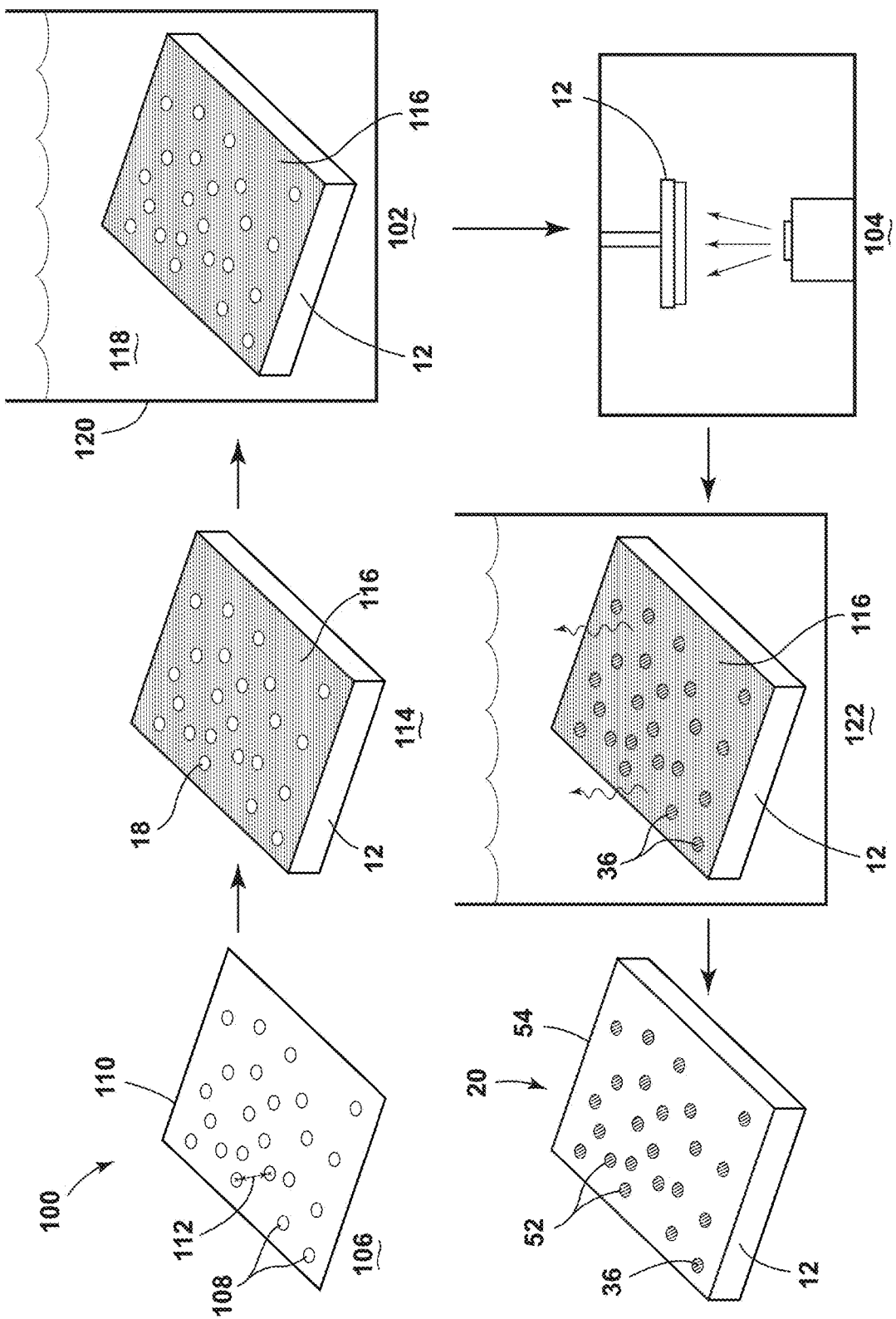
FIG. 5 is a schematic diagram of a method of forming embodiments of the textured region of FIG. 1, illustrating steps of determining the position of the surface features, placing an etching mask on the substrate to effectuate formation of the surface features at the determined position, forming the surface features via etching while the etching mask is on the substrate, depositing the high-index material onto the substrate while the etching mask is still on the substrate, and then removing the etching mask.

Referring now to FIG. 5, a method 100 of forming the textured region 20 is herein described. At a step 102, the method 100 includes forming the surface features 52 projecting from or disposed within the surrounding portion at the primary surface 18 of the substrate 12 according to a predetermined positioning of each surface feature 52. At a step 104, the method 100 further includes depositing the high-index material 36 on either the surface features 52 or surrounding portion 54, which provides the one or more lower surfaces 32 residing at the lower mean elevation 34. Steps 102 and 104 will be discussed further below.

In embodiments, at a step 106, the method 100 further includes determining the positioning of each surface feature 52 utilizing a spacing distribution algorithm. The result is the predetermined positioning of each surface feature 52 mentioned above. This step 106 is performed before the step 102 of forming the surface features 52 into the substrate 12. Example spacing distribution algorithms include Poisson disk sampling, maxi-min spacing, and hard-sphere distribution. The spacing distribution algorithms place objects 108 (representative of the surface features 52, or from which placement of the surface features 52 can be derived) on an area 110 in accordance with a minimum center-to-center distance 112 separating each object 108, which can match the minimum center-to-center distance 60 desired for the surface features 52.

Poisson disk sampling inserts a first object 108 (circular, with a diameter matching the longest dimension 58 desired for the surface features 52) into the area 48. Then the algorithm inserts a second object 108 within the area 48, placing the center at a random point within the area 48. If the placement of the second object 108 satisfies the minimum center-to-center distance 112 from the first object 108, then the second object 108 stays in the area 48. The algorithm then repeats this process until no more such objects 180 can be placed within the area 110 that satisfies the minimum center-to-center distance 112. The result is a random distribution, but specific placement, of the objects 108.

The maxi-min spacing algorithm is so named because it attempts to maximize the minimum nearest-neighbor center-to-center distance 112 of a point distribution (i.e., the objects of the area here are points). Because it proceeds iteratively, moving each object 108 to another place where it is further from any neighbors, the algorithm usually does not achieve a perfect hexagonal lattice. It produces a random distribution with a relatively high degree of mean hexagonality, often exceeding 90%.

The hard-sphere distribution algorithm is a molecular dynamics simulation performed at a finite temperature. In particular, it is the LAMMPS Molecular Dynamics Simulator (https://www.lammps.org/, last visited Jun. 26, 2021). The result is a random but specific placement of objects 108 in the area 110 that differ from a hexagonal lattice. However, again, there is a higher degree of hexagonality than would result from a Poisson disk algorithm.

In any event, the positioning of the objects 108 in the area 110 thus becomes the predetermined positioning of each surface feature 52 that is subsequently formed into the substrate 12, or the predetermined position of each surface feature 52 is derived from the positioning of the objects 108 in the area 110.

In embodiments, at a step 114, the method 100 further includes disposing an etching mask 116 on the primary surface 18 of the substrate 12. The subsequent step 102 of forming the surface features 52 includes contacting the substrate 12 with an etchant 118 while the etching mask 116 is disposed on the primary surface 18 of the substrate 12.

In embodiments, the etching mask 116 is formed on the substrate 12 as either a superimposed positive or a superimposed negative of area 110 on which the spacing distribution algorithm placed the objects 108. In other words, in embodiments, the etching mask 116 is formed to match the placement of the objects 108 on the primary surface 18 of the substrate 12, in which case the etching mask 116 prevents subsequent etching where the surface features 52 are to be formed in accordance with the predetermined positioning of the surface features 52. In such instances, the surface features 52 that result from the etching step 102 project from the surrounding portion 54). In other embodiments (such as illustrated at FIG. 4), the etching mask 116 is formed as a negative of the placement of the objects 108 on the area 110, preventing etching where the surrounding portion 54 is to be and allowing etching only where the surface features 52 are to be (i.e., where the objects were placed in the area).

In embodiments, the etchant 118 includes one or more of hydrofluoric acid and nitric acid. In embodiments, the etchant 118 includes both hydrofluoric acid and nitric acid. The etchant 118 can be sprayed onto the substrate 12 while the etching mask 116 is on the substrate 12. The substrate 12 with the etching mask 116 can be dipped into a vessel 120 containing the etchant 118. In embodiments, the etchant 118 contacts the substrate 12 for a time period of 10 seconds, 20 seconds, 30 seconds, 40 seconds, 50 seconds, or 60 seconds, or within any range bounded by any two of those values (e.g., 10 seconds to 60 seconds, and so on). After the period of time has concluded, the substrate 12 is rinsed in deionized water and dried. The longer the period of time that the etchant 118 contacts the substrate 12, the deeper the etchant 118 etches into the substrate 12 and thus the greater the distance 42 between the one or more higher surfaces 26 of the substrate 12 residing at the higher mean elevation 28 and the one or more lower surfaces 32 of the substrate 12 residing at the lower mean elevation 34.

As mentioned, at the step 104, the method 100 includes depositing the high-index material 36 on either the surface features 52 or the surrounding portion 54. In embodiments, the high-index material 36 is deposited while the etching mask 116 is still disposed on the substrate 12 after the surface features 52 were formed during the step 102. Maintaining the etching mask 116 on the substrate 12 while depositing the high-index material 36 helps ensure that the high-index material 36 is deposited only where desired, such as only on the one or more lower surfaces 32 of the substrate 12 residing at the lower mean elevation 34, whether those be provided by the surface features 52 or the surrounding portion 54, and not onto the one or more higher surfaces 26 residing at the higher mean elevation 28. Various deposition methods such as vacuum deposition techniques, for example, chemical vapor deposition (e.g., plasma enhanced chemical vapor deposition, low-pressure chemical vapor deposition, atmospheric pressure chemical vapor deposition, and plasma-enhanced atmospheric pressure chemical vapor deposition), physical vapor deposition (e.g., reactive or nonreactive sputtering or laser ablation), thermal or e-beam evaporation and/or atomic layer deposition can be utilized to deposit the high-index material 36. In embodiments, reactive sputtering is used to deposit the high-index material 36.

In embodiments, at a step 122, the method 100 further includes removing the etching mask 116 after the high-index material 36 has been deposited at the step 104. Depending on the composition of the etching mask 116, an organic solvent such as acetone or isopropyl alcohol can remove the etching mask 116 from the substrate 12.

In a variation, before step 114, the a film of the low-index material is deposited on the primary surface 18 of the substrate 12. The etching mask 116 is then disposed on the substrate 12 over the low-index material. Then at step 102, the surface features 52 are formed by contacting the low-index material with the etchant 118 while the etching mask 116 is disposed on the low-index material. The rest of the method 100 then proceeds as explained above.

EXAMPLES

Comparative Example 1A

For Example 1, a commercial software package, Gsolver (Grating Solver Development Company, Saratoga Springs, Utah, USA) was utilized to model embodiments of the textured region of the present disclosure as a diffraction grating. The substrate was modeled as having a surrounding portion providing surfaces at a higher mean elevation and then linear channels (as surface features) disposed within the surrounding portion providing surfaces at a lower mean elevation below the higher mean elevation. The linear channels had a center-to-center spacing of 20 µm (the grating period). The model assumed ambient light with a single wavelength of 550 nm. The substrate was assumed to be a glass having an index of refraction of 1.518. A high-index material having a higher index of refraction of 1.892, particularly a $SiO_xN_y$, was added on the surfaces of the linear channels residing at the lower mean elevation, for a fill-fraction of 50%. The high-index material thus provided surfaces all residing at an intermediate mean elevation between the higher mean elevation and the lower mean elevation of the substrate. The air trench depth (the distance between the higher mean elevation of the substrate the intermediate mean elevation of the high-index material deposited within the linear channels) was set to be 220 nm. The trench depth (the distance between the higher mean elevation and the lower mean elevation of the substrate) was then varied from about 220 nm to over 700 nm, and the height of high-index material deposited within the channels adjusted accordingly to maintain the air trench depth of 220 nm. The model then calculated the diffraction efficiency for both light transmitting through the modeled textured region (FIG. 6A) and light reflecting off of the modeled textured region (FIG. 6B), for $0^{th}$ through $5^{th}$ diffraction orders, as a function of the trench depth (and thus also height of high-index material added to maintain the 220 nm air trench depth). The modeled results are reproduced at FIGS. 6A and 6B for transmitted light and reflected light respectively.

Figure 6A:
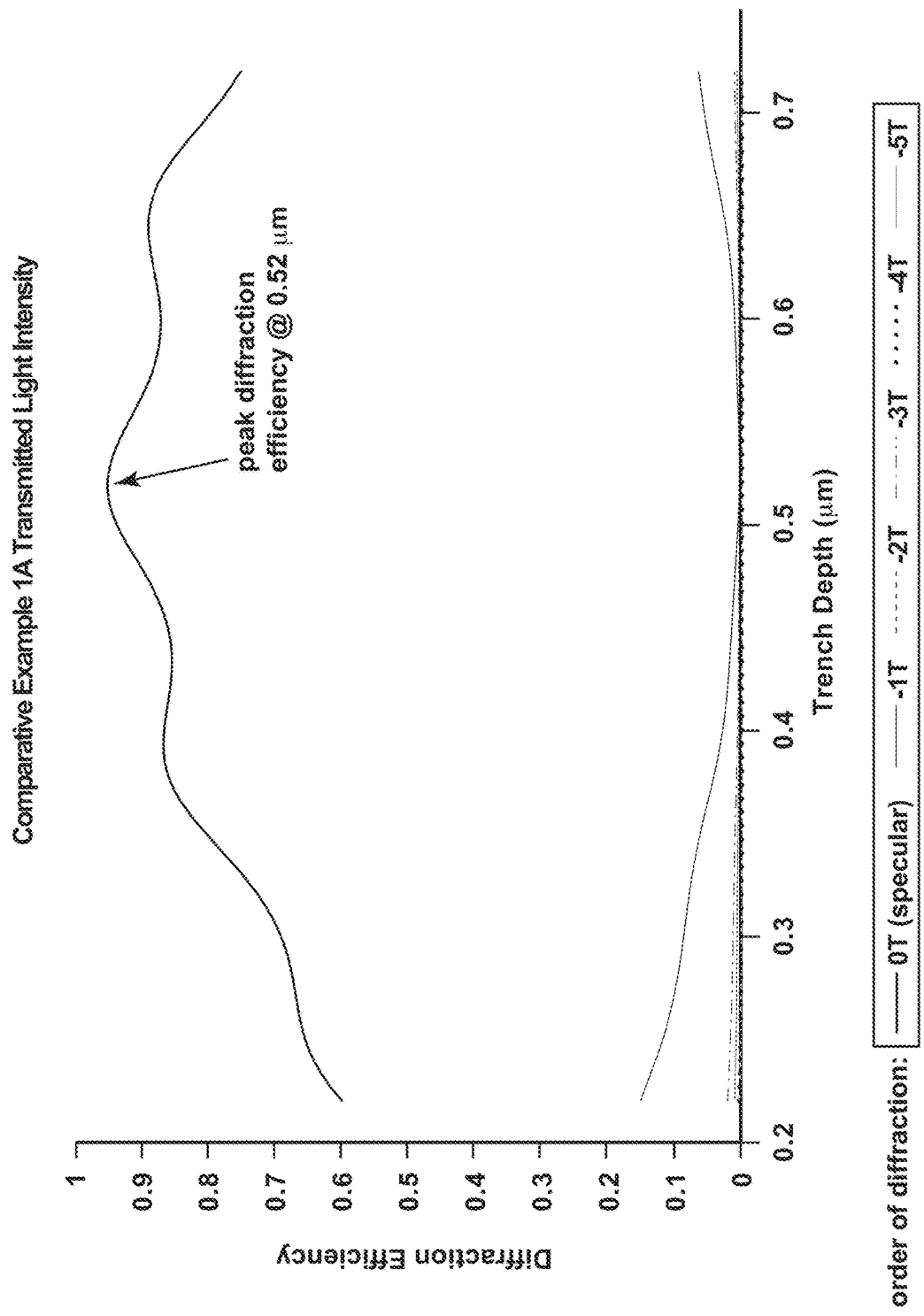
FIG. 6A is a graph pertaining to Comparative Example 1A, illustrating diffraction efficiency of transmitted light through the textured region of the substrate as a function of trench depth (i.e., the distance between the higher mean elevation and the lower mean elevation)
Figure 6B:
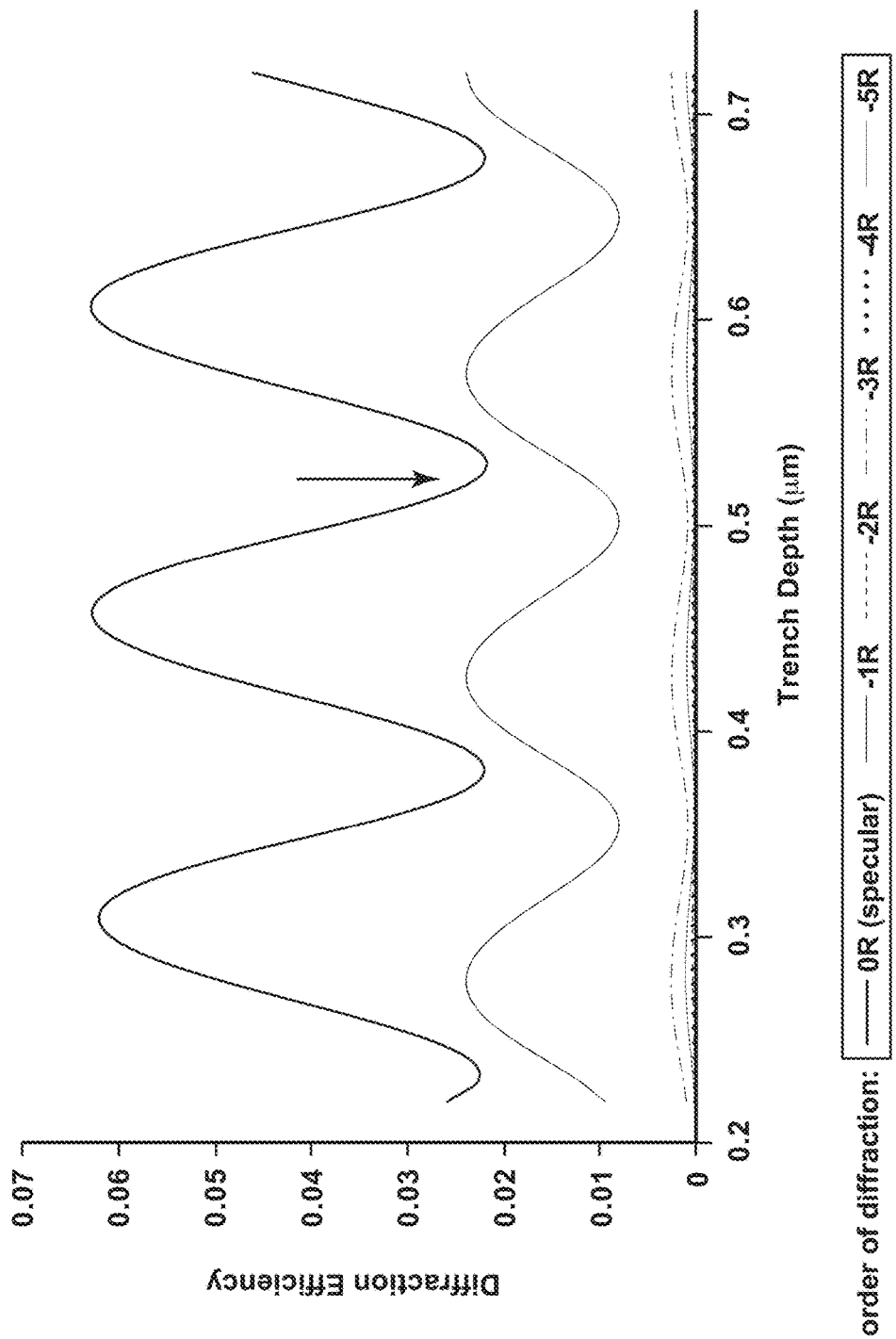
FIG. 6B is a graph pertaining to Comparative Example 1A, illustrating diffraction efficiency of reflected light off the textured region of the substrate as a function of trench depth.

The modeled results reproduced at FIG. 6A show that, to maximize transmittance through the substrate out the textured region, the trench depth of substrate should be 520 nm (0.52 µm). Thus, the height of the high-index material of $SiO_xN_y$ added to the linear channels should be 300 nm to maintain the air trench depth of 220 nm. Unfortunately, as the modeled results reproduced at FIG. 6B show, the trench depth of the substrate of 520 nm does not quite minimize specular reflectance (the $0^{th}$ order is specular).

Example 1B

Example 1B is a modeling example similar to Comparative Example 1A. However, Example 1B did not fix the air trench depth and vary the trench depth of the substrate, as Comparative Example 1A did. Rather, Example 1B fixed the ratio of the depth of the air trench depth of the substrate to height of the $SiO_xN_y$ high-index material and to the air trench depth as 3/1.6/1.4. The model then determined the diffraction efficiency for both transmitted light (FIG. 7A) and reflected light (FIG. 7B) as a function of varied trench depth of the substrate. The parameters of the model for Example 1B were otherwise the same as Comparative Example 1A, including a fill-fraction of 50% for the $SiO_xN_y$ high-index material.

Figure 7A:
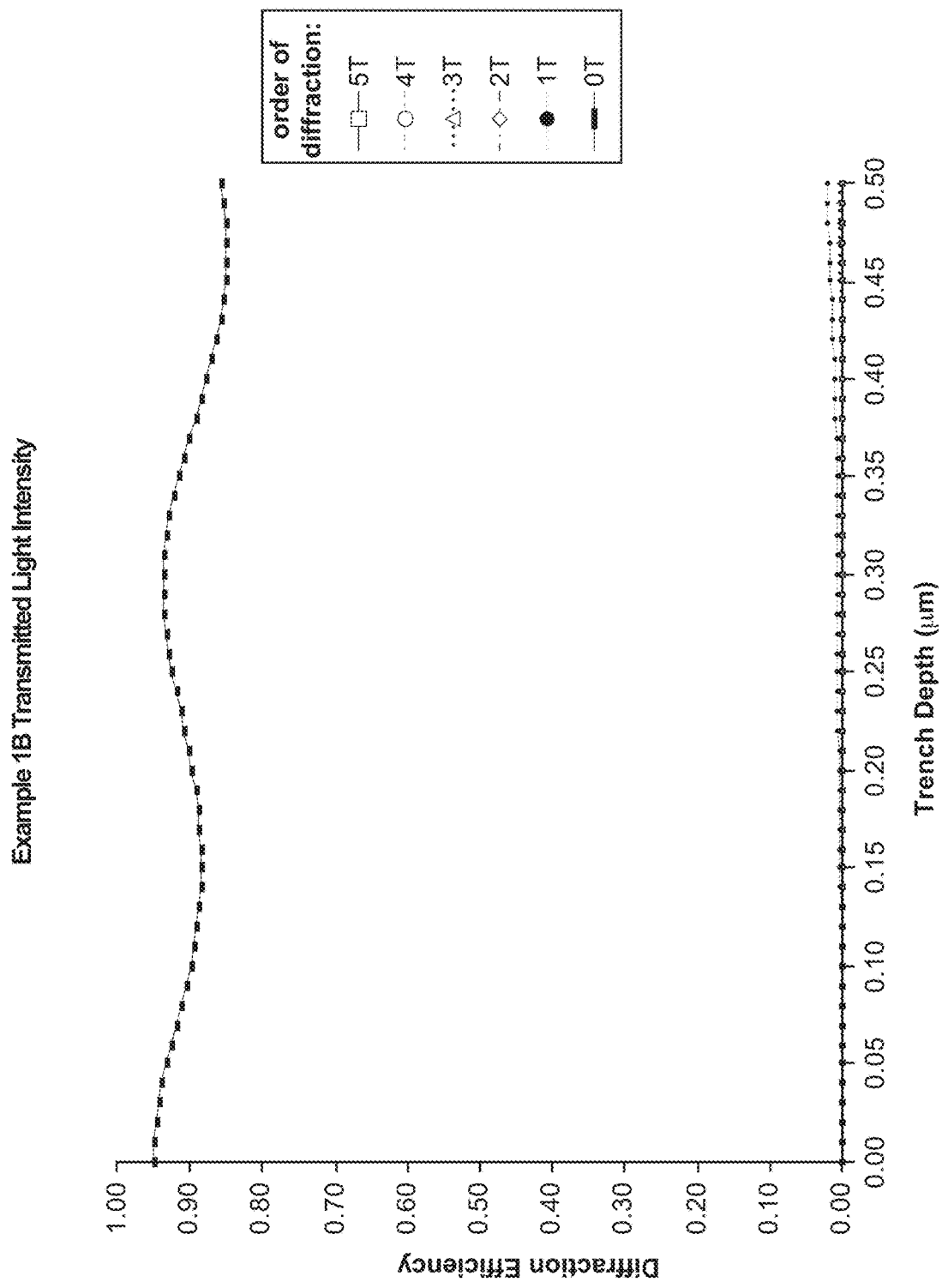
FIG. 7A is a graph pertaining to Example 1B, illustrating diffraction efficiency of transmitted light through the textured region of the substrate as a function of trench depth.
Figure 7B:
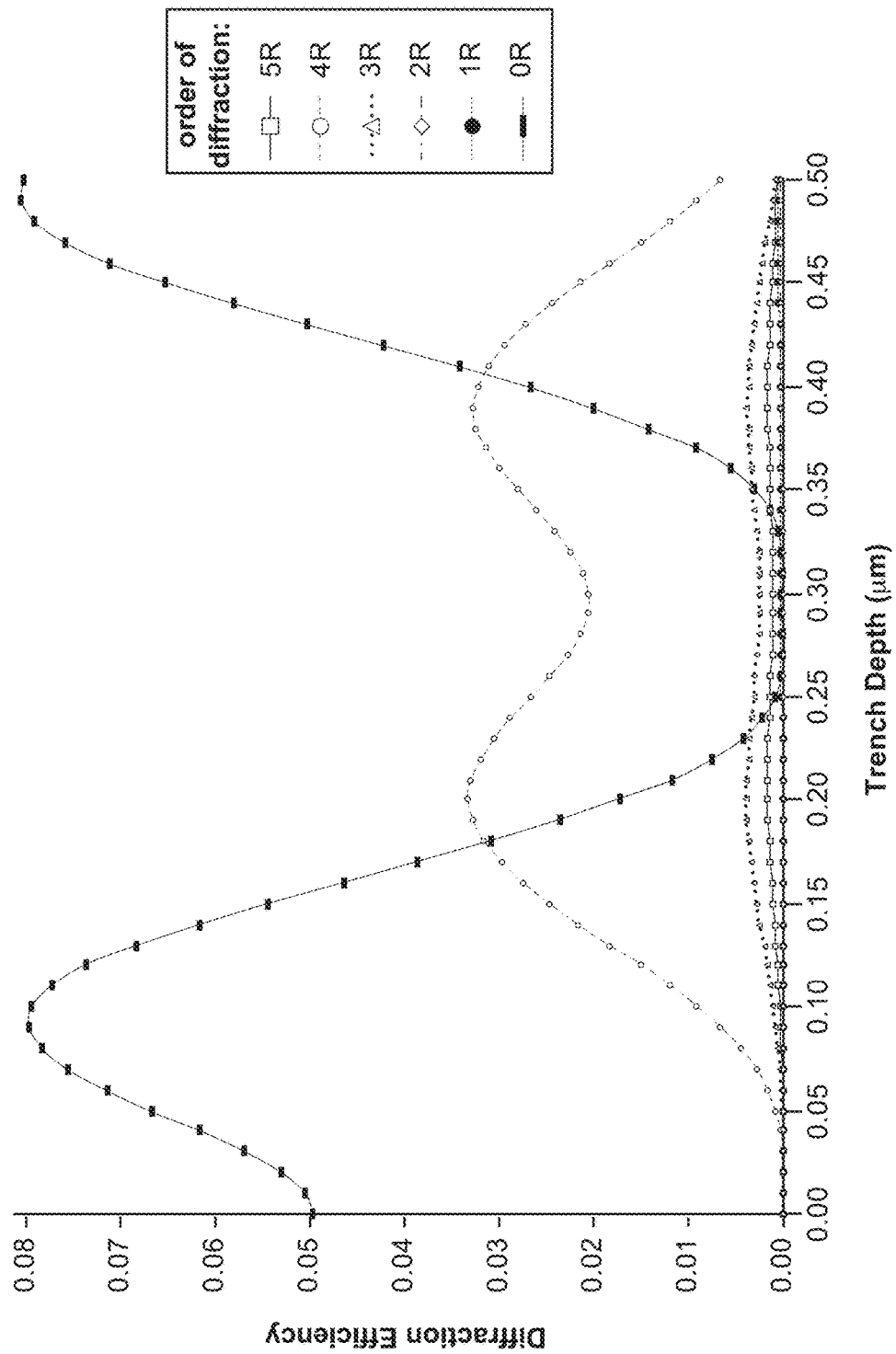
FIG. 7B is a graph pertaining to Example 1B, illustrating diffraction efficiency of reflected light off the textured region of the substrate as a function of trench depth.

The graph at FIG. 7A reveals that $0^{th}$ order (specular, not diffracted) transmission through the substrate out the textured region remains high regardless of the trench depth of the substrate. Diffracted transmission ($1^{st}$ order and higher) is very close to zero. That is because the ratio 3/1.6/1.4 described above is close to ideal for a transparent diffuser. The graph at FIG. 7B reveals that specular reflectance ($0^{th}$ order) and scattered reflectance ($1^{st}$ order and higher) varies significantly as the trench depth of the substrate varies. Specular reflectance peaks when the trench depth of the substrate is about 0.10 µm and 0.50 µm, making those trench depths of the substrate not preferable. However, specular reflectance is minimized when the trench depth of the substrate is between 0.22 µm and 0.37 µm. Diffracted reflectance of the $1^{st}$ order is additionally minimized at about 0.30 µm. Using the ratio mentioned above, when trench depth of the substrate is between 0.22 µm and 0.37 µm, then the height of the $SiO_xN_y$ high-index material is 0.12 µm to 0.20 µm and the air trench depth is 0.10 µm to 0.20 µm. An example target using the model is 0.32 µm for the trench depth of the substrate, 0.17 µm for the height of the $SiO_xN_y$ high-index material disposed within the surface features, and an air trench depth of 0.15 µm. This model further illustrates that, with the proper design, the textured region as disclosed herein can suppress specular reflectance compared to non-textured flat glass by a factor of 5 or even 10 or more.

Figure 7D:
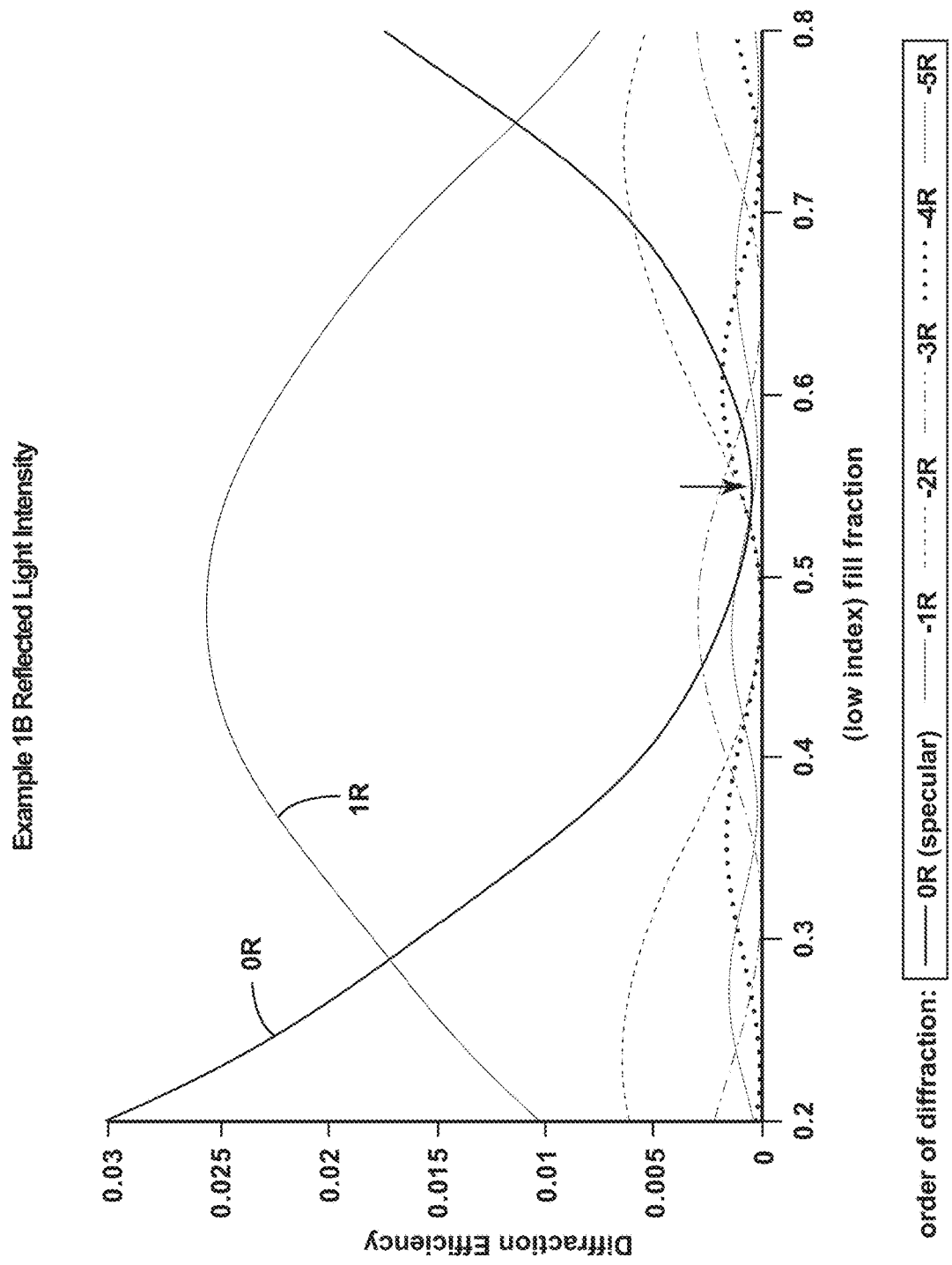
FIG. 7D is a graph pertaining to Example 1B, illustrating diffraction efficiency of reflected light off the textured region of the substrate as a function of the fill-fraction of the substrate (i.e., the percentage of a plane through the high-index material of the textured region that the substrate occupies)

Referring now to FIGS. 7C and 7D, the model then determined diffraction efficiency for both transmission (FIG. 7C) and reflection (FIG. 7D) as a function of varying fill-fraction of the $SiO_xN_y$ high-index material (100% minus the fill-fraction of the low index substrate). The model assumed 0.32 µm for the trench depth of the substrate, 0.17 µm for the height of the $SiO_xN_y$ high-index material disposed within the surface features, and an air trench depth of 0.15 µm. The 20 µm center-to-center distance and wavelength of 550 nm remain as assumption for the model. The graph of FIG. 7C shows that, according to the model, the specular transmission is high and transmitted scattering is low for all fill-fractions considered. That is because the trench depth of the substrate, the height of the $SiO_xN_y$ high-index material disposed within the surface features, and the air trench depth were already optimized according to transparent diffuser criteria. The graph of FIG. 7D shows that, according to the model, a fill-fraction range for the substrate (low index) of 52% to 62% minimizes specular reflection ($0^{th}$ order). That corresponds to a fill-fraction range for the $SiO_xN_y$ high-index material of 38% to 48%. In some applications, the optimal design may not target suppression specular reflection ($0^{th}$ order) alone, but may seek to minimize the intensity of the specular reflectance while also minimizing the intensity of one or more higher diffracted orders in reflection ($1^{st}$ order, $2^{nd}$ order, etc.). In applications where it is desirable to minimize the intensity of all reflected diffracted orders, a fill-fraction for the low refractive index substrate or low-index material may be as high as 75%, or from about 55% to about 78%. That corresponds to a fill-fraction for the high-index material (e.g. $SiO_xN_y$) of 25%, or from about 22% to about 45%.

Figure 7E:
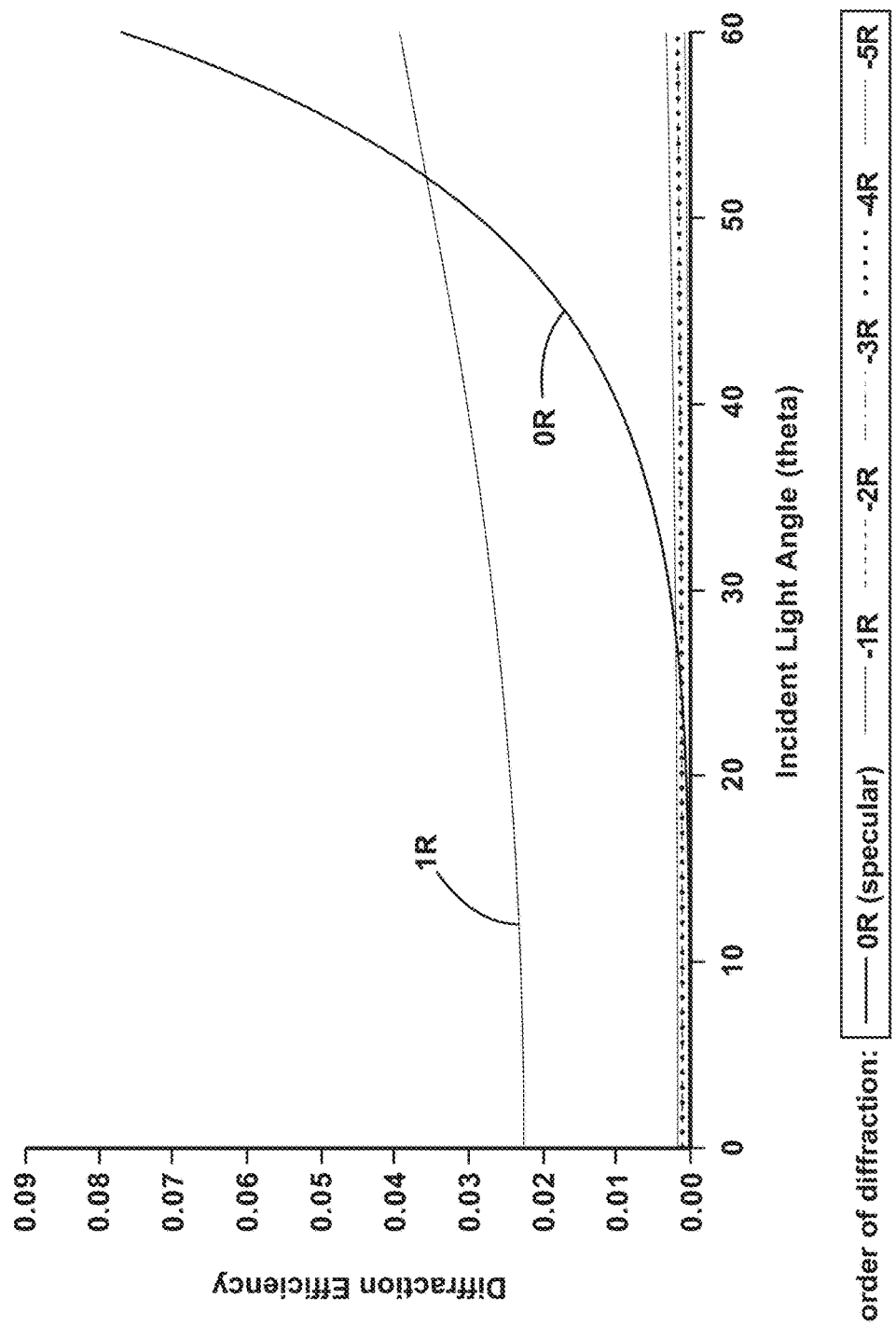
FIG. 7E is a graph pertaining to Example 1B, illustrating diffraction efficiency of transmitted light through the textured region of the substrate as a function of the angle of the incident light.
Figure 7F:
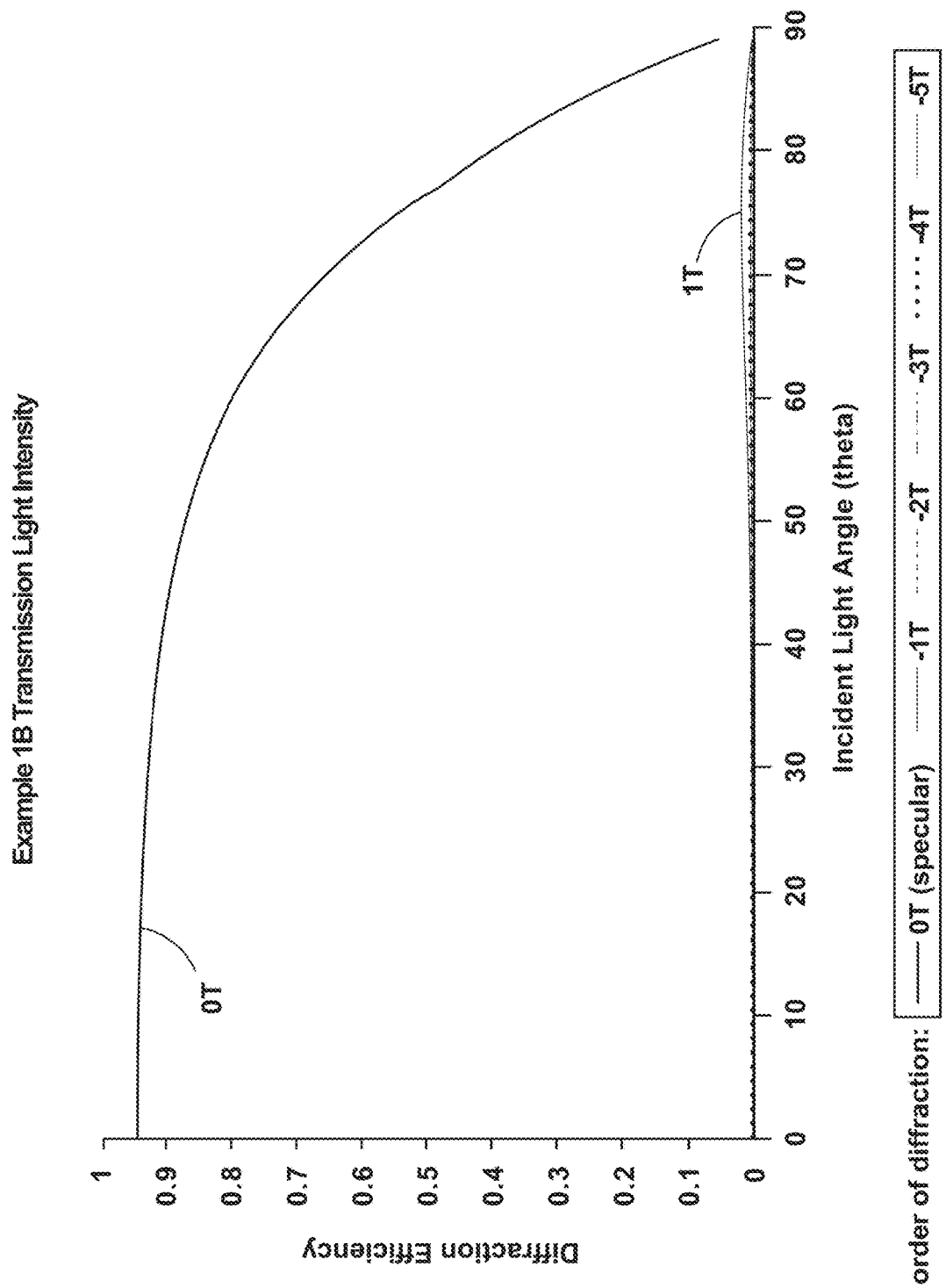
FIG. 7F is a graph pertaining to Example 1B, illustrating diffraction efficiency of reflected light off the textured region of the substrate as a function of the angle of the incident light.

Referring now to FIGS. 7E and 7F, the model determined reflectance (FIG. 7E) and transmittance (FIG. 7F) as a function of incident light angle, for the modeled best parameters of 45% fill-fraction for the $SiO_xN_y$ high-index material, trench depth of the substrate of 0.32 µm, $SiO_xN_y$ high-index material height of 0.17 µm, and air trench depth of 0.15 µm. As the graph of FIG. 7E shows, such a textured region is modeled to generate less than 1% specular reflectance (first surface) for all light incidence angles from 0 to about 40 degrees. As the graph of FIG. 7F shows, such as textured region is modeled to transmit over 90% of incident light for all light incidence angles from 0 to about 40 degrees.

Examples 2A-2G

For Examples 2A-2G, a hard sphere spacing distribution algorithm (LAMMPS) was utilized to determine the positioning of each surface feature to be placed onto the primary surface 18 of a substrate. The hard sphere spacing distribution algorithm targeted to fill an assigned area so that the objects placed, which were circles, occupied 50% of the area. This would translate to the high-index material deposited on the substrate having a fill-fraction targeted to be 50%. The circles had a diameter of 50 µm and a minimum center-to-center spacing of 60 µm. More specifically, using the software, a gas of "molecules" representing the objects (and thus the surface features desired) was initially placed on a two-dimensional hexagonal lattice to fix the fill fraction at 50%. Then the gas was heated and allowed to randomize in two dimensions. The molecules were endowed with a repulsive hard-sphere potential to maintain the minimum center-to-center spacing of 60 µm. The resulting objects within the area were placed as set forth in the graph of FIG. 2. The resulting objects have a mean hexagonality of 0.49, indicating a large deviation from a hexagonal lattice and thus a high degree of randomized but specific placement. The graph reproduced at FIG. 8 is a histogram showing the fraction of total objects placed within the area as a function actual center-to-center spacing from nearest neighbor.

An etching mask was then formed on seven samples of a glass substrate, superimposing the placement of the objects pursuant to the hard sphere spacing distribution algorithm. The etching mask for each sample was configured to allow etching into the substrate where the hard sphere spacing distribution algorithm positioned the objects within the area, but deny etching into the substrate outside of where the objects were positioned. The substrates of all seven samples with the etching mask were then contacted with an etchant. Each sample was contacted with the etchant for a different period of time, allowing for the generation of surface features providing varying trench depths. The etchant formed surface features disposed within a surrounding portion, with the surface features being positioned throughout the textured region where the algorithm placed the objects within the area. Two of the samples were then set aside as Examples 2F and 2G to be comparative examples.

After etching, the etching mask was maintained on the substrate of the remaining samples of Examples 2A-2E. High-index material with a higher index of refraction (~2.1) than the substrate (~1.51), specifically AlN, was deposited onto the surface of each of the surface features. The deposition time for some of the samples varied, resulting in different heights of the high-index material deposited. The etching mask was thereafter removed from the substrates of each of the samples. Due to fabrication process steps and a small amount of shadowing during deposition, the fill fraction of the high index material AlN was in a range of 40-49%.

All samples representing Examples 2A-2G were then subjected to various optical measurements. Specifically, the pixel power deviation ("PPD"), transmittance ("Trans."), transmission haze ("haze"), distinctness-of-image ("DOI"), and specular reflectance ("Spec. Ref.") were measured. The results for each sample is set forth in Table 1 below, as well as the air trench depth and height of the AlN high-index material deposited within each surface feature. The numbers for Examples 2F and 2G for "air trench depth" mean difference in elevation between the substrate at the surface features and the substrate at the surrounding portion, because these are comparative examples and no AlN high-index material was deposited into the surface features. The optical profilometer scan reproduced at FIG. 2 is of Example 2C, after the AlN high-index material was disposed within the surface features.

TABLE 1

| Example | Air trench depth (µm) | AlN height (µm) | PPD (%) | Trans. (%) | Haze (%) | DOI (%) | Spec. Ref. (%) |
|---|---|---|---|---|---|---|---|
| 2A | 0.16 | 0.16 | 2.11 | 92.0 | 2.27 | 62 | 0.83 |
| 2B | 0.17 | 0.15 | 1.32 | 92.3 | 1.66 | 30 | 0.74 |
| 2C | 0.17 | 0.15 | 1.47 | 92.3 | 1.68 | 43 | 0.83 |
| 2D | 0.2 | 0.11 | 2.05 | 92.1 | 2.14 | 71 | 1.23 |
| 2E | 0.21 | 0.10 | 2.02 | 92.3 | 1.92 | 82 | 1.52 |

TABLE 1-continued

| Example | Air trench depth (μm) | AlN height (μm) | PPD (%) | Trans. (%) | Haze (%) | DOI (%) | Spec. Ref. (%) |
|---|---|---|---|---|---|---|---|
| 2F (comparative) | 0.31 | None | 6.12 | 93.2 | 2.38 | 99 | 3.58 |
| 2G (comparative) | 0.16 | None | 3.97 | 93.2 | 1.57 | 49 | 0.74 |

Analysis of the data set forth in Table 1 reveals that the incorporation of the high-index material within the surface features for Examples 2A-2E caused a great reduction in pixel power deviation compared to both Examples 2F and 2G, without negatively impacting the other measured optical properties in a major way. Examples 2B and 2C in particular demonstrate beneficial combination of measured optical properties—specifically, a pixel power deviation of less than 1.5, transmittance of greater than 92%, a transmission haze of under 2%, a distinctness-of-image of less than 50%, and a specular reflectance of under 0.85%. These combinations of values have been difficult or impossible to achieve using other approaches, especially with surface features having a longest dimension of about 50 μm, which are easier to manufacture than if the surface features had a smaller longest dimension.

Examples 3A-3D

Figure 9:
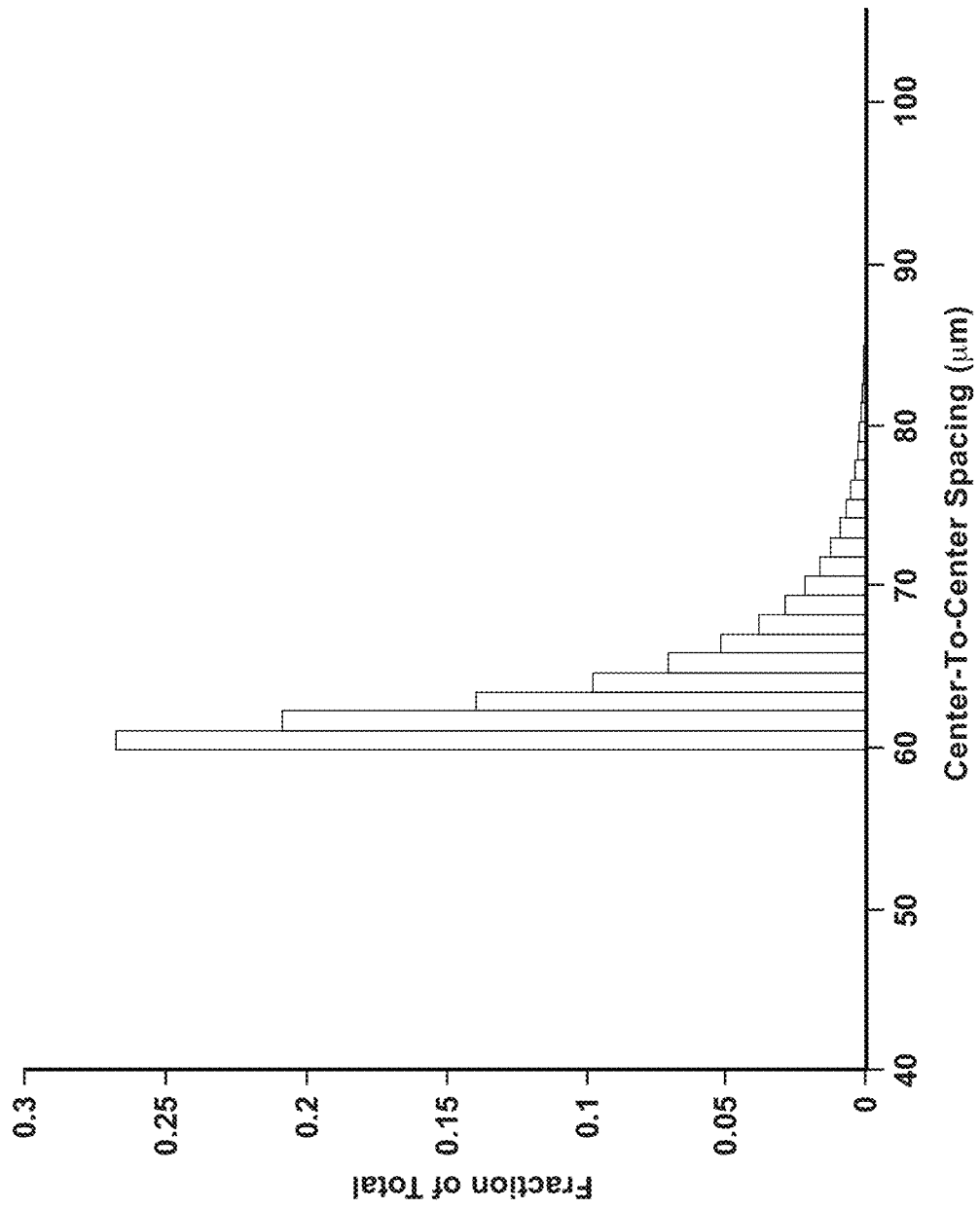
FIG. 9 is a histogram pertaining to Examples 3A-3D, illustrating the center-to-center distance of objects randomly placed into an area (to assign placement of subsequently formed surface features of a textured region) via another spacing distribution algorithm.

For Examples 3A-3D, a spacing distribution algorithm implementing Poisson disk sampling was utilized to determine the positioning of each surface feature to be placed onto the primary surface of a substrate. The algorithm targeted to fill an assigned area so that the objects placed, which were circles, occupied 36% of the area. This would translate to the high-index material deposited within the surface features having a fill-fraction targeted to be 36%. The circles had a diameter of 50 μm and a minimum center-to-center spacing of 60 μm. The circles that the algorithm placed within the area had a hexagonality, H, of 0.41, which is low and considered highly randomized. The graph reproduced at FIG. 9 is a histogram showing the fraction of total objects placed within the area as a function actual center-to-center spacing from nearest neighbor.

An etching mask was then formed on four samples of a glass substrate, superimposing the placement of the objects pursuant to the hard sphere spacing distribution algorithm. The etching mask for each sample was configured to allow etching into the substrate where the hard sphere spacing distribution algorithm positioned the objects within the area, but deny etching into the substrate outside of where the objects were positioned. The substrates of all four samples with the etching mask were then contacted with an etchant. The etchant formed surface features disposed within a surrounding portion, with the surface features being positioned throughout the textured region where the algorithm placed the objects within the area. Two of the samples were then set aside as Examples 3C and 3D as comparative examples.

After etching, the etching mask was maintained on the substrate of the remaining samples of Examples 3A-3B. High-index material with a higher index of refraction (~2.1) than the substrate (~1.51), specifically AlN, was deposited within each of the surface features by reactive sputtering. The etching mask was thereafter removed from the substrates of each of the samples. Due to fabrication process steps and a small amount of shadowing during deposition, the fill fraction of the AlN high-index material was in a range of 30-35%.

All samples representing Examples 3A-3D were then subjected to various optical measurements. Specifically, the pixel power deviation ("PPD"), transmittance ("Trans."), transmission haze ("haze"), distinctness-of-image ("DOI"), and specular reflectance ("Spec. Ref.") were measured. The results for each sample is set forth in Table 2 below, as well as the air trench depth and height of the AlN high-index material deposited within each surface feature. The numbers for Examples 3C and 3D for "air trench depth" mean the depth of the surface features relative to the surrounding portion (because there was no AlN added).

TABLE 2

| Example | Air trench depth (μm) | AlN height (μm) | PPD (%) | Trans. (%) | Haze (%) | DOI (%) | Spec. Ref. (%) |
|---|---|---|---|---|---|---|---|
| 3A | 0.16 | 0.16 | 1.91 | 90.8 | 2.34 | 82 | 1.82 |
| 3B | 0.16 | 0.16 | 1.44 | 91.1 | 2.15 | 80 | 1.67 |
| 3C (comparative) | 0.31 | None | 6.17 | 92.5 | 2.45 | 98 | 3.39 |
| 3D (comparative) | 0.16 | None | 4.95 | 93.4 | 1.09 | 60 | 0.93 |

Analysis of the data set forth in Table 2 reveals that the incorporation of the high-index material within the surface features for Examples 3A-3B caused a great reduction in pixel power deviation compared to both Examples 3C and 3D, without negatively impacting the other measured optical properties in a major way. Distinctness-of-image values that are less than 85% for Examples 3A and 3B show a suppression of specular reflection.

What is claimed is:

1. A substrate for a display article, the substrate comprising:
   a primary surface; and
   a textured region on at least a portion of the primary surface, the textured region comprising:
      one or more higher surfaces residing at a higher mean elevation parallel to a base-plane disposed below the textured region;

one or more lower surfaces residing at a lower mean elevation parallel to the base-plane that is less than the higher mean elevation, and a high-refractive index material disposed on each of the one or more lower surfaces, the high-refractive index material forming one or more intermediate surfaces residing at an intermediate mean elevation parallel to the base-plane that is greater than the lower mean elevation but less than the higher mean elevation, the high-refractive index material comprising an index of refraction that is greater than an index of refraction of the substrate or a low-index material providing the one or more higher surfaces, wherein, the intermediate mean elevation of the high-refractive index material is greater than the lower mean elevation of the one or more lower surfaces by a distance within a range of from 100 nm to 200 nm.

2. The substrate of claim 1, wherein:

the index of refraction of the substrate or the low-refractive index material is within a range of 1.4 to 1.6; and the index of refraction of the high-refractive index material is higher than the index of refraction of the substrate or the low-refractive index material.

3. The substrate of claim 1, wherein the intermediate mean elevation of the high-refractive index material is less than the higher mean elevation of the one or more higher surfaces by a distance within a range of 100 nm to 190 nm.

4. The substrate of claim 1, wherein the intermediate mean elevation of the high-refractive index material is less than the higher mean elevation of the one or more higher surfaces by a distance within a range of 130 nm to 180 nm.

5. The substrate of claim 1, wherein the high-refractive index material occupies 22% to 49% of an area of a plane that is (i) parallel to the base-plane and (ii) that extends through the high-refractive index material, the area bound by the textured region.

6. The substrate of claim 1, wherein the substrate comprises a glass substrate or glass-ceramic substrate.

7. The substrate of claim 1, wherein the textured region exhibits a pixel power deviation in a range of 1.2-2.1%.

8. The substrate of claim 1, wherein the textured region exhibits a pixel power deviation of less than 1.5%.

9. The substrate of claim 1, wherein the textured region exhibits a specular reflectance in a range of 0.5-1.75%.

10. The substrate of claim 1, wherein the textured region exhibits a specular reflectance of less than 0.85%.

11. The substrate of claim 1, wherein the textured region exhibits a distinctness-of-image of 25% to 85%.

12. The substrate of claim 1, wherein the textured region exhibits a distinctness-of-image of less than 50%.

13. The substrate of claim 1, wherein the textured region exhibits a transmission haze of less than 2.5%.

14. The substrate of claim 1, wherein the textured region exhibits a transmittance of greater than 92%.

15. The substrate of claim 1, wherein the high-refractive index material comprises AlNx, SiOxNy, or SiNx.

16. The substrate of claim 1, wherein the textured region comprises air trenches above the high-refractive index material that have an air trench depth between the higher mean elevation and the intermediate mean elevation.

17. The substrate of claim 16, wherein the intermediate mean elevation of the high-refractive index material is greater than the lower mean elevation of the one or more lower surfaces by a distance within a range of 120 nm to 180 nm.

18. The substrate of claim 16, wherein the lower mean elevation of the one or more lower surfaces is less than the higher mean elevation of the one or more higher surfaces by a distance within a range of 220 nm to 370 nm.

19. A method of forming a textured region of a substrate for a display article, the method comprising:

forming surface features projecting from or disposed within a surrounding portion at a primary surface of a substrate according to a predetermined positioning of each surface feature, thus forming a textured region, wherein (i) one or more higher surfaces of the textured region reside at a higher mean elevation parallel to a base-plane disposed below the textured region, (ii) one or more lower surfaces of the textured region reside at a lower mean elevation parallel to the base-plane that is less than the higher mean elevation, (iii) the surface features provide either the one or more higher surfaces or the one or more lower surfaces, and (iv) the surrounding portion provides the other of the one or more higher surfaces or the one or more lower surfaces, whichever the surface features do not provide; and depositing a high-refractive index material on whichever of the surface features or the surrounding portion provide the one or more lower surfaces residing at the lower mean elevation, the high efractive index material (i) exhibiting an index of refraction that is greater than the index of refraction of the substrate and (ii) forming one or more intermediate surfaces residing at an intermediate mean elevation parallel to the base-plane that is between the higher mean elevation and the lower mean elevation, wherein, the intermediate mean elevation of the high-refractive index material is greater than the lower mean elevation of the one or more lower surfaces by a distance within a range of from 100nm to 200 nm.

20. A substrate for a display article, the substrate comprising:

a primary surface; and a textured region on at least a portion of the primary surface, the textured region comprising:

one or more higher surfaces residing at a higher mean elevation parallel to a base-plane disposed below the textured region and extending through the substrate;

one or more lower surfaces residing at a lower mean elevation parallel to the base-plane that is less than the higher mean elevation; and a high-refractive index material disposed on each of the one or more lower surfaces residing at the lower mean elevation, the high-refractive index material forming one or more intermediate surfaces residing at an intermediate mean elevation parallel to the base-plane that is greater than the lower mean elevation but less than the higher mean elevation, the high-refractive index material comprising an index of refraction that is greater than an index of refraction of the substrate or a low-refractive index material providing the one or more higher surfaces, wherein, the textured region exhibits a pixel power deviation in a range of 1.2-2.1%.

wherein, the textured region exhibits a specular reflectance in a range of 0.5-1.75%, wherein, the index of refraction of the substrate or the low-refractive index material is within a range of from 1.4 to 1.6, and wherein, the index of refraction of the high-refractive index material is within a range of 1.6 to 2.3.

21. A substrate for a display article, the substrate comprising:
- a primary surface; and
- a textured region on at least a portion of the primary surface, the texture region comprising:
  - one or more higher surfaces residing at a higher mean elevation parallel to a base-plane disposed below the textured region and extending through the substrate;
  - one or more lower surfaces residing at a lower mean elevation parallel to the base-plane that is less than the higher mean elevation;
  - surface features projecting from or disposed within a surrounding portion at the primary surface, wherein (i) the surface features provide either the one or more higher surfaces or the one or more lower surfaces, (ii) the surrounding portion provides the other of the one or more higher surfaces or the one or more lower surfaces, whichever the surface features are not providing; and
  - a high-refractive index material disposed on the one or more lower surfaces residing at the lower mean elevation, the high-refractive index material comprising (i) an index of refraction that is greater than an index of refraction of the substrate or a low-refractive index material providing the one or more higher surfaces and (ii) one or more intermediate surfaces residing at an intermediate mean elevation parallel to the base-plane that is between the higher mean elevation and the lower mean elevation,
- wherein, each surface feature has a perimeter parallel to the base-plane, and
- wherein, the perimeter of each surface feature has a longest dimension within a range of from 5 µm to 200 µm.

22. The substrate of claim 20, wherein
the intermediate mean elevation of the high-refractive index material is less than the higher mean elevation of the one or more higher surfaces by a distance within a range of 100 nm to 190 nm, and
the lower mean elevation of the one or more lower surfaces is less than the higher mean elevation of the one or more higher surfaces by a distance within a range of 220 nm to 370 nm.

23. The substrate of claim 21, wherein
the intermediate mean elevation of the high-refractive index material is less than the higher mean elevation of the one or more higher surfaces by a distance within a range of 100 nm to 190 nm, and
the lower mean elevation of the one or more lower surfaces is less than the higher mean elevation of the one or more higher surfaces by a distance within a range of 220 nm to 370 nm.

* * * * *